(12) United States Patent
Wach

(10) Patent No.: US 9,601,892 B2
(45) Date of Patent: *Mar. 21, 2017

(54) METHOD AND SYSTEM FOR MANAGING THERMALLY SENSITIVE OPTICAL DEVICES

(71) Applicant: CIRREX SYSTEMS, LLC, Wilmington, DE (US)

(72) Inventor: Michael L. Wach, Alpharetta, GA (US)

(73) Assignee: CIRREX SYSTEMS, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/242,724

(22) Filed: Apr. 1, 2014

(65) Prior Publication Data

US 2014/0376579 A1 Dec. 25, 2014

Related U.S. Application Data

(63) Continuation of application No. 12/660,221, filed on Feb. 23, 2010, now Pat. No. 8,699,533.

(Continued)

(51) Int. Cl.
*H01S 3/04* (2006.01)
*H01S 3/00* (2006.01)
(Continued)

(52) U.S. Cl.
CPC .............. *H01S 3/0014* (2013.01); *H01S 3/04* (2013.01); *H01S 3/23* (2013.01); *H01S 5/02212* (2013.01);
(Continued)

(58) Field of Classification Search
CPC ........ H01S 3/1028; H01S 5/0288; H01S 3/23; H01S 5/026
(Continued)

(56) References Cited

U.S. PATENT DOCUMENTS 5,768,654 A * 6/1998 Noguchi ............ G03G 15/2003
219/216
6,292,498 B1 9/2001 Pfaff
(Continued)

*Primary Examiner* — Tuan Nguyen
(74) *Attorney, Agent, or Firm* — Ascenda Law Group, PC

(57) ABSTRACT

Two or more lasers or other temperature sensitive optical devices can be disposed in an operating environment, for example in a common enclosure exposed to the environment. The environment can have a temperature that fluctuates, for example in connection with random events, weather, seasons, etc. Each laser's temperature can track the temperature of the environment in steps, with each laser following a distinct temperature track. The lasers can alternate outputting light into a wavelength division multiplexing channel. For example, during one timeframe, one laser can provide an optical communication signal having a wavelength complying with a wavelength division multiplexing criterion. During another timeframe, the other laser can provide an optical signal having substantially the same wavelength. Operating a laser at an elevated temperature can shorten laser lifetime. To mitigate temperature induced failure, a replacement laser can be engaged when a failure predictor, precursor, or indicator meets a threshold.

2 Claims, 15 Drawing Sheets

Related U.S. Application Data

(60) Provisional application No. 61/208,414, filed on Feb. 23, 2009.

(51) Int. Cl.

| | | |
|---|---|---|
| *H01S 5/022* | (2006.01) | |
| *H01S 5/024* | (2006.01) | |
| *H01S 5/0683* | (2006.01) | |
| *H01S 3/23* | (2006.01) | |
| *H01S 5/026* | (2006.01) | |
| *H01S 5/028* | (2006.01) | |
| *H01S 5/12* | (2006.01) | |
| *H01S 5/183* | (2006.01) | |
| *H01S 5/40* | (2006.01) | |

(52) U.S. Cl.
CPC ........ *H01S 5/02415* (2013.01); *H01S 5/0683* (2013.01); *H01S 5/4031* (2013.01); *H01S 5/026* (2013.01); *H01S 5/0287* (2013.01); *H01S 5/0288* (2013.01); *H01S 5/02284* (2013.01); *H01S 5/12* (2013.01); *H01S 5/183* (2013.01); *H01S 5/4012* (2013.01)

(58) Field of Classification Search
USPC .......................................................... 372/34
See application file for complete search history.

(56) References Cited

U.S. PATENT DOCUMENTS

| | | | | |
|---|---|---|---|---|
| 6,493,125 | B1* | 12/2002 | Tanaka .................. | H01S 5/0687 372/29.011 |
| 6,567,198 | B1* | 5/2003 | Kang .................. | H04B 10/572 398/192 |
| 7,366,214 | B2* | 4/2008 | Liu .......................... | H01S 3/13 372/38.02 |
| 2008/0002929 | A1 | 1/2008 | Bowers et al. | |
| 2008/0267233 | A1* | 10/2008 | Deng .................. | H01S 5/02453 372/34 |
| 2009/0022185 | A1* | 1/2009 | Machida ................ | H01S 5/024 372/20 |

\* cited by examiner

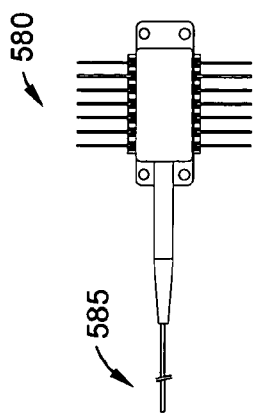
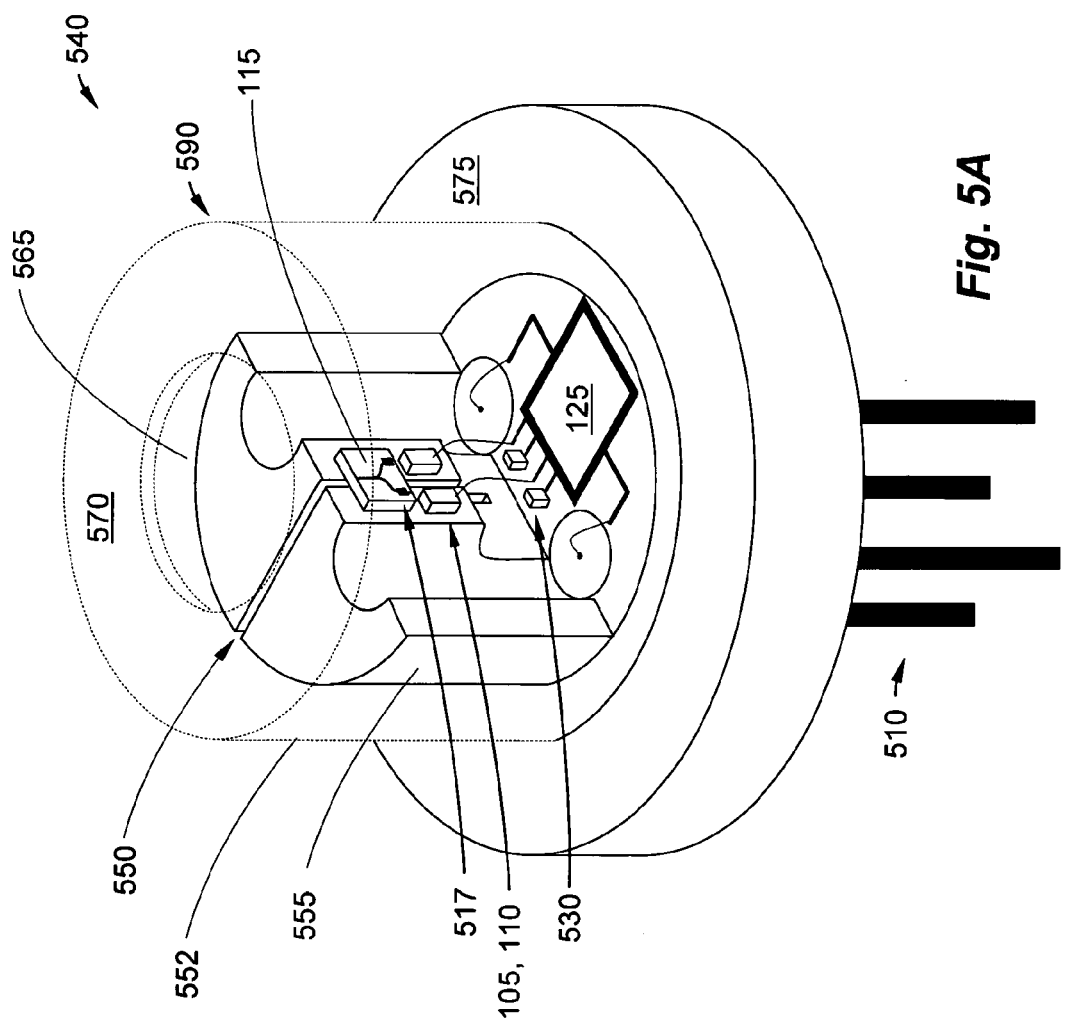
Fig. 5A
Fig. 5B

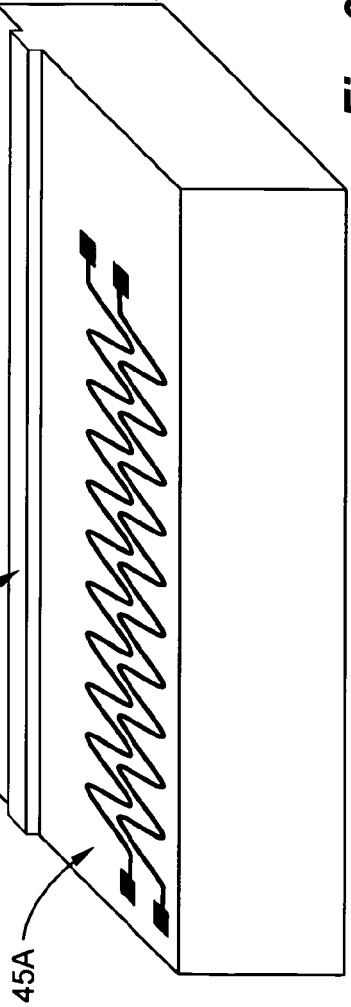
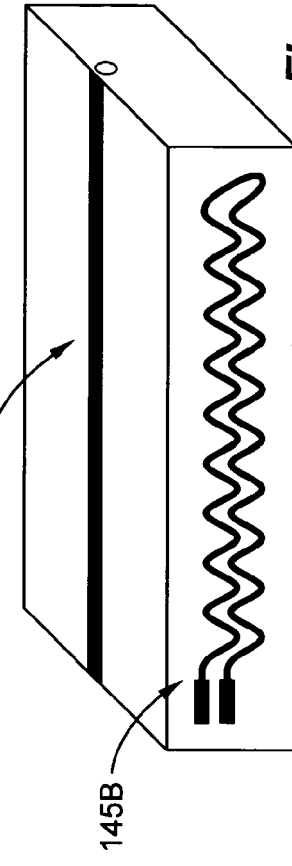

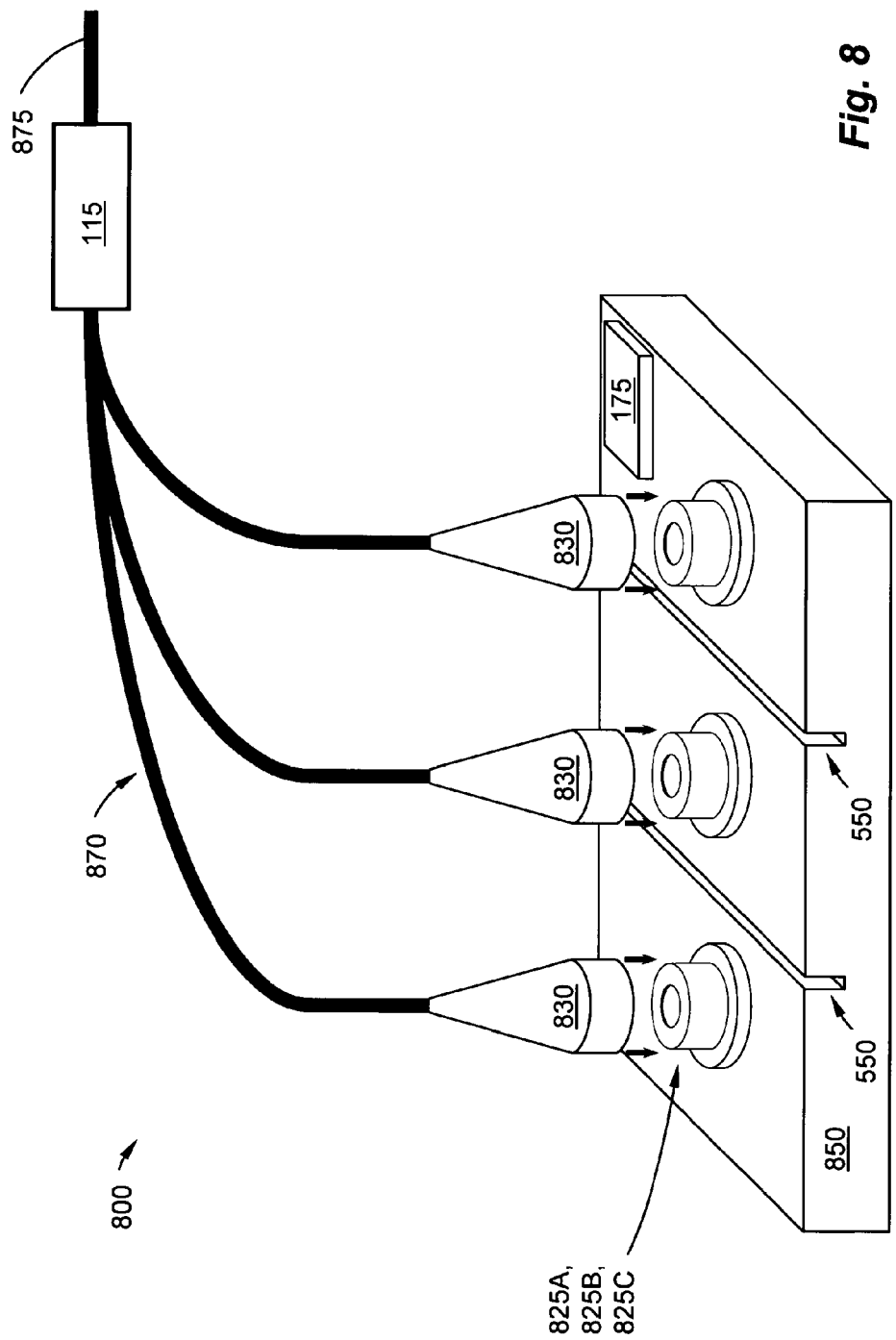

METHOD AND SYSTEM FOR MANAGING THERMALLY SENSITIVE OPTICAL DEVICES

CROSS REFERENCE TO RELATED APPLICATIONS

This application is a continuation of application Ser. No. 12/660,221 filed on Feb. 23, 2010 which issued as U.S. Pat. No. 8,699,533, which claims priority to U.S. Provisional Patent Application No. 61/208,414 filed Feb. 23, 2009 in the name of Wach and entitled "Method and System for Managing Thermally Sensitive Optical Devices," the entire contents of which are hereby incorporated herein by reference.

TECHNICAL FIELD

The present technology relates generally to optical communications and more particularly to using alternating lasers to feed optical signals of like wavelength to a common optical waveguide, wherein each laser's temperature is individually regulated to track ambient or environmental temperature in steps. The present technology can also relate to operating a laser at a temperature elevated above an environmental temperature and engaging a replacement laser in advance of premature laser failure associated with high temperature operation.

BACKGROUND

Various lasers and other devices that manage light can be sensitive to temperature, and a light processing outcome or result may depend upon device temperature. For many lasers, lasing wavelength shifts according to temperature of a gain medium and/or an associated feedback element. Often, the wavelength shifts gradually with changing temperature and then abruptly changes in connection with a "mode hop." Further, lifetime of a laser typically shortens with heightened operating temperature. Running the laser at an elevated temperature increases probability of failure as compared to running the laser in a cooled state.

One conventional approach to addressing temperature sensitivity involves actively cooling the laser with a thermal electric cooler ("TEC") system that creates a regulated operating temperature. The TEC system keeps the laser cool to avoid shifting of the laser's wavelength and to prolong lifetime.

However, introducing a TEC into a lasing system can pose formidable issues, including disposing heat the TEC has extracted from the laser. TEC cooling involves transporting heat that has been removed from the laser, along a path that may traverse and adversely affect other electrical, optical, or optoelectronic devices. Moreover, handling the extracted heat typically entails deploying other thermal management devices, such as heat sinks, air conditioners, fans, convection systems, etc., that introduce their own set of complications. As another issue, TECs and associated equipment consume substantial amounts of electrical power, thereby involving support power supplies and operating expenses. As another issue, most conventional TECs are typically large, perhaps one hundred, one thousand, or even more times larger than a tiny laser die that is cooled. In many potential applications, space is a premium and compact designs are desirable.

Another significant issue concerns packaging TEC-cooled lasers and other optical devices. When a TEC cools a laser (or other device) below an ambient temperature or a temperature of an operating environment, any water vapor or humidity of the environment tends to condense on the surfaces of the cool laser. This effect is analogous to the common experience of condensation forming on the exterior surfaces of a glass of ice water setting on an outdoor table in a humid summer day. Such condensation can cause significant problems with optical, electrical, semiconductor, and/or optoelectronic devices. Problems can include material degradation, electrical shorts, impedance variations, and interfering with a light beam's propagation via diffracting, scattering, refracting, or otherwise changing the beam. If condensation forms on a surface upon which light is incident (or through which light passes), the condensation can disturb or distort the incident light, analogously to the manner in which condensation formed on a bathroom mirror distorts a reflected image. To avoid formation of condensation, cooled optical communication lasers typically are sealed in hermetic enclosures that prevent permeation of water vapor to optical surfaces, gaps through which light passes, and sensitive components. Any water vapor or other detrimental containment that does enter an enclosure is captured by a special chemical substance (known as a "getter") placed inside the enclosure. Unfortunately, hermetic enclosures typically pose significant issues related to complexity of manufacturing, baking operations, heightened material expenses, and increased size.

In view of the foregoing discussion of representative deficiencies in the art, need exists for improved technology that can address thermal issues and sensitivities of optical devices, including lasers with outputs that vary according to operating temperature. For example, need exists for a technology that can support achieving tightly controlled optical parameters with non-hermetic packaging, without thermal electric cooling, with power efficiency, with compact size, with long life, with economy, and/or with manufacturability. A technology addressing one or more of such needs, or some other related shortcoming in the art, would promote optical applications including, but not limited to, greater utilization of high-speed optical communications.

SUMMARY

The present invention supports operating temperature sensitive devices. In one aspect of the present invention, multiple lasers can be disposed in an operating environment in which temperature fluctuates or changes in a somewhat unpredictable or random manner. Temperature of the operating environment may fluctuate due to weather conditions, diurnal changes, day-night cycles, day-to-day variations, hour-to-hour variations, year-to-year variations, seasonal effects, random events, conditions of sunshine and shade, variations in angle of sunlight, equipment failures, one or more unknown or unidentified phenomena, etc. Each laser can track the operating environment's fluctuating temperature in steps, increments, or discrete values; with each laser's temperature taking a distinct track, course, path, or route. At certain times, one laser may be at one temperature step while another laser is at another temperature step. The lasers can run, operate, or otherwise emit light alternatingly, for example operating in sequence, in turn, or in rotation. With the lasers taking turns operating, each laser can have a different temperature during its operational turn. Operating temperatures can change in connection with switching between or among states of operation. The operating lasers can emit light of like wavelength or light complying with a specification regarding wavelength, color, polarization, amplitude, coherency, or some other appropriate parameter.

For example, the emitted light of each laser can feed into a common wavelength division multiplexing ("WDM") channel, a common course wavelength division multiplexing ("CWDM") channel, or a common dense wavelength division multiplexing (DWDM) channel.

The term "wavelength division multiplexing" or "WDM," as used herein, generally refers to transmitting, propagating, or conducting multiple optical signals, each conveying different or distinct information, on a common medium or along a common path, wherein each optical signal has a different wavelength or color or is assigned to a different region of the light spectrum. WDM often involves multiplexing multiple optical carrier signals on a single optical waveguide or fiber with different wavelengths or colors of light carrying different signals. The herein usage of the term "wavelength division multiplexing" or "WDM" is believed to be substantially consistent with typical industry terminology.

The term "course wavelength division multiplexing" or "CWDM," as used herein, generally refers to a type of WDM wherein one optical medium or path carries about four or more WDM signals that are spaced at least about 10 nm from one another. For example, a first CWDM channel could be assigned the spectral range 1310-1320 nm, a second CWDM channel could be assigned the spectral range 1320-1330 nm, a third CWDM channel could be assigned the spectral range 1330-1340 nm, and so forth.

The term "dense wavelength division multiplexing" or "DWDM," as used herein, generally refers to a type of WDM wherein WDM wavelengths are positioned on a grid having a spacing of about 200 Giga-Hertz (GHz) or less (about 1.6 nm). Thus, each DWDM signal can be assigned to a wavelength channel having a width of about 200 GHz (about 1.6 nm) or less. Many DWDM schemes (though not necessarily all) conform to the "ITU" specifications published by the International Telecommunication Union. For example, a first DWDM signal may be assigned the optical spectrum of 1528.77-1529.16 nm, a second DWDM signal may be assigned the optical spectrum of 1529.55-1529.94 nm, a third DWDM signal may be assigned the optical spectrum of 1530.33-1530.72 nm, and so forth.

In one aspect of the present invention, multiple lasers can be disposed in an operating environment in which temperature fluctuates or changes in a somewhat unpredictable or random manner. Temperature of the operating environment may fluctuate due to weather conditions, diurnal changes, day-night cycles, day-to-day variations, hour-to-hour variations, year-to-year variations, seasonal effects, random events, conditions of sunshine and shade, variations in angle of sunlight, equipment failures, unknown phenomena, etc. One of the lasers can be operated at a temperature elevated above the highest expected temperature incursion associated with the temperature fluctuations. Such elevated-temperature operation can statistically shorten that laser's lifetime relative to low-temperature operation. The amount of accumulated operating time at the elevated temperature can be tracked and compared to an expected lifetime. Expected lifetime can be estimated from failure-in-time "FIT" testing, statistical analysis, or some other appropriate methodology. When the probability of laser failure reaches a threshold, a different one of the lasers can be engaged as a replacement for the laser that is approaching its end of life. Accordingly, one or more duplicate, reserve, backup, secondary, standby, alternate, extra, substitute, redundant, or supplementary lasers can mitigate shortened lifetime associated with high-temperature operation.

The discussion of managing operations of devices presented in this summary is for illustrative purposes only. Various aspects of the present invention may be more clearly understood and appreciated from a review of the following detailed description of the disclosed embodiments and by reference to the figures and claims. Other aspects, systems, processes, methods, features, advantages, benefits, and objects of the present invention will become apparent to one of ordinary skill in the art upon examination of the following detailed description and the accompanying figures. It is intended that all such aspects, systems, processes, methods, features, advantages, benefits, and objects are to be included within this description, are to be within the scope of the present invention, and are to be protected by the accompanying claims.

BRIEF DESCRIPTION OF THE FIGURES

FIG. 5A is a perspective illustration of a lasing system packaged in a TO-can-style enclosure in accordance with certain exemplary embodiments of the present invention.

FIG. 5B is an overhead illustration of a butterfly package enclosing a lasing system in accordance with certain exemplary embodiments of the present invention.

FIG. 6 is perspective illustration of a laser die comprising a heating element in accordance with certain exemplary embodiments of the present invention.

FIG. 7 is a perspective illustration of a laser die comprising a heating element in accordance with certain exemplary embodiments of the present invention.

FIG. 8 is a perspective illustration of a lasing system comprising three packaged lasers in accordance with certain exemplary embodiments of the present invention.

Figure 1:
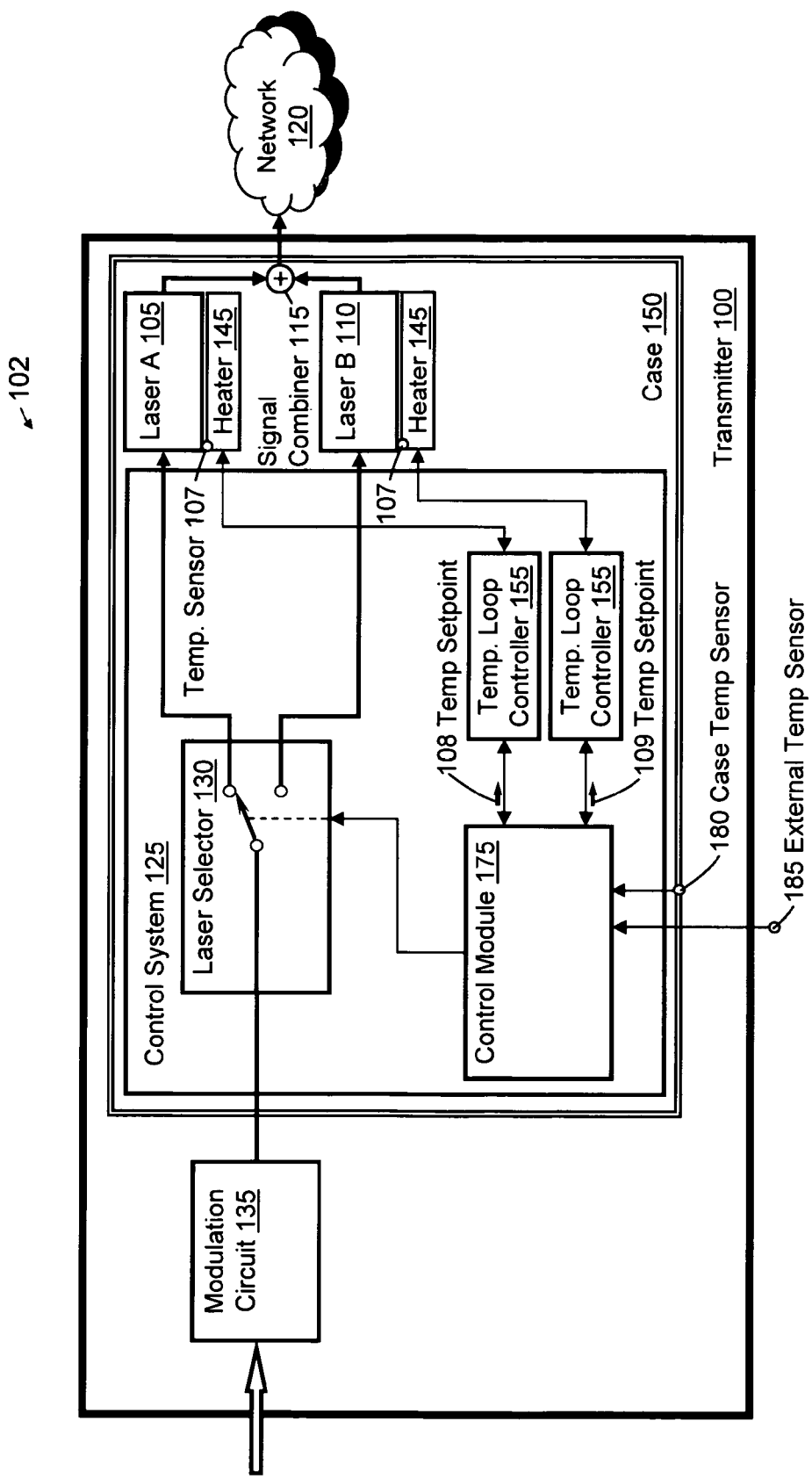
FIG. 1 is a functional block diagram of an optical communication system in accordance with certain exemplary embodiments of the present invention.

Many aspects of the present invention can be better understood with reference to the above figures. The elements and features shown in the figures are not necessarily to scale, emphasis instead being placed upon clearly illustrating principles of exemplary embodiments of the present invention. Moreover, certain dimensions may be exaggerated to help visually convey such principles. In the figures, reference numerals designate like or corresponding, but not necessarily identical, elements throughout the several views.

DETAILED DESCRIPTION OF EXEMPLARY EMBODIMENTS

Certain exemplary embodiments of the present invention support controlling two or more temperature sensitive optical devices such that at least one of the devices achieves an operational objective in an environment of fluctuating temperature. For example, two lasers that are subjected to fluctuating ambient temperatures can be operated so that one of the lasers emits or generates light of a target wavelength.

The present invention will be discussed more fully hereinafter with reference to FIGS. 1-14, which provide additional information regarding representative or, illustrative embodiments of the present invention.

Figure 2A:
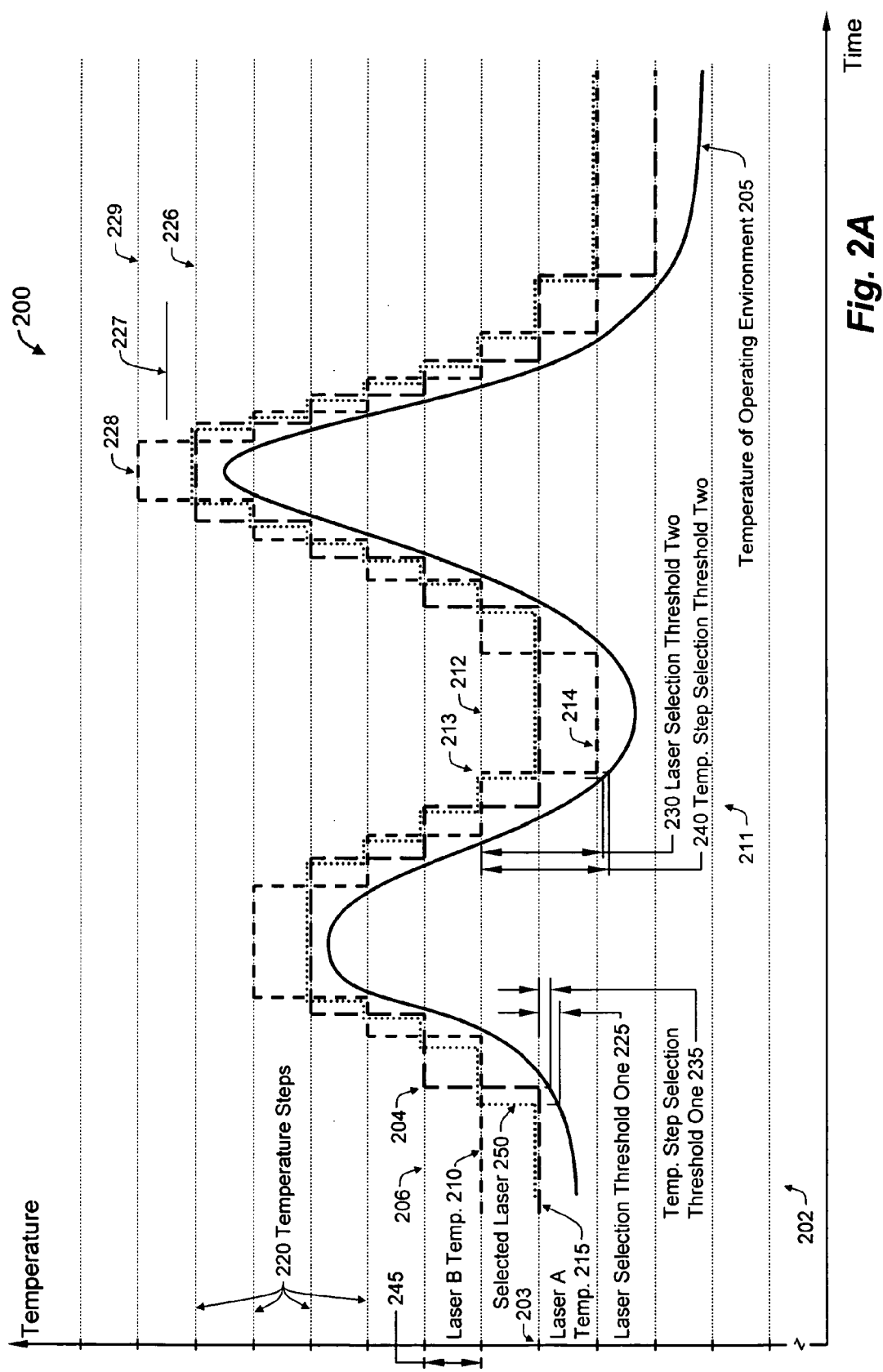
FIG. 2A is a graph of laser temperatures and environmental temperature over time in accordance with certain exemplary embodiments of the present invention.
Figure 2B:
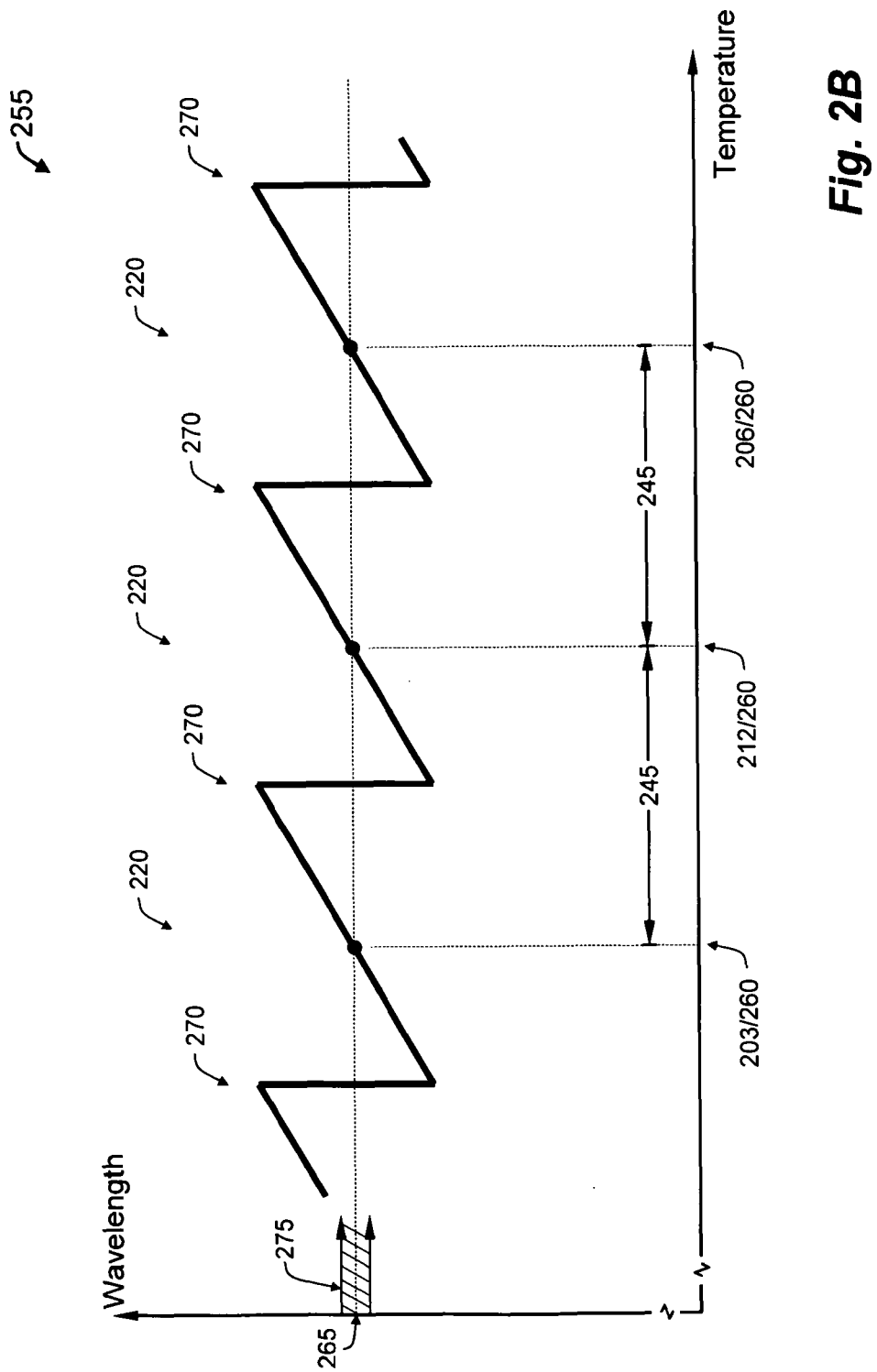
FIG. 2B is a plot of wavelength of a laser as a function of temperature in accordance with certain exemplary embodiments of the present invention.
Figure 3:
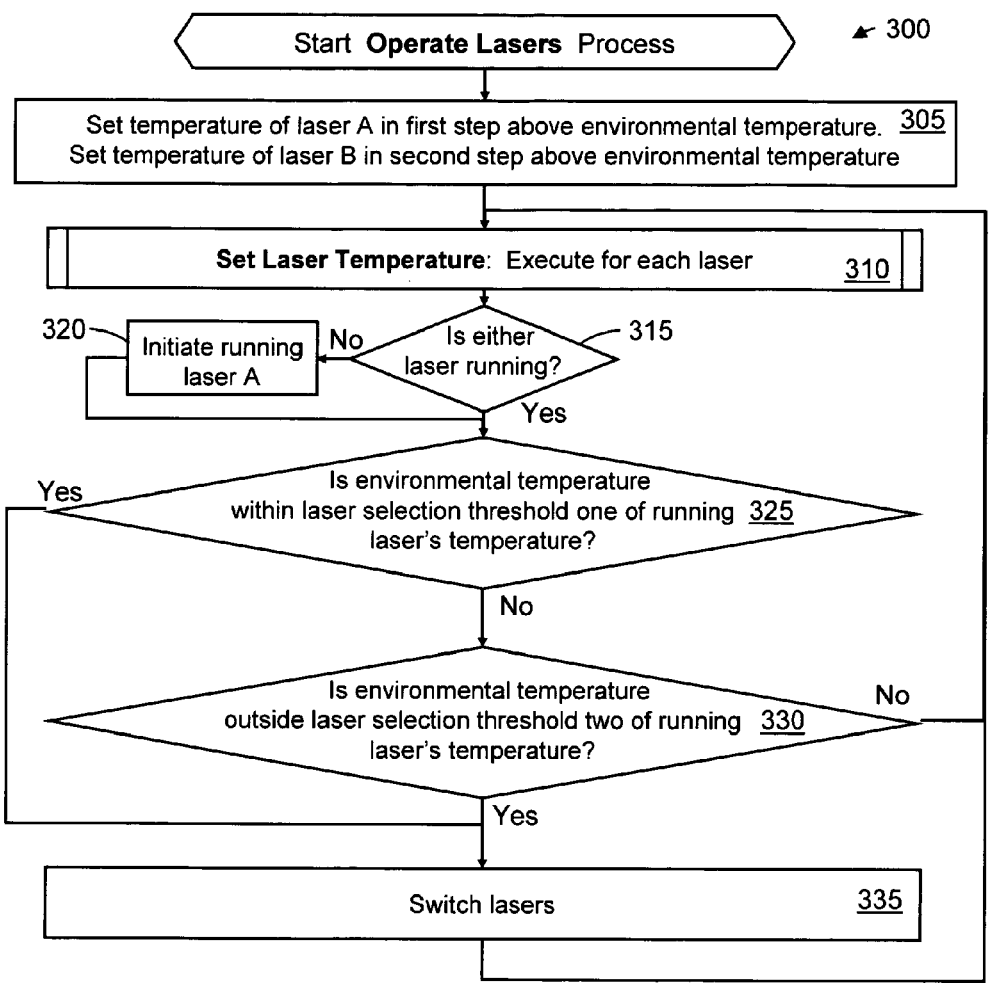
FIG. 3 is a flowchart of a process for operating lasers in accordance with certain exemplary embodiments of the present invention.
Figure 4:
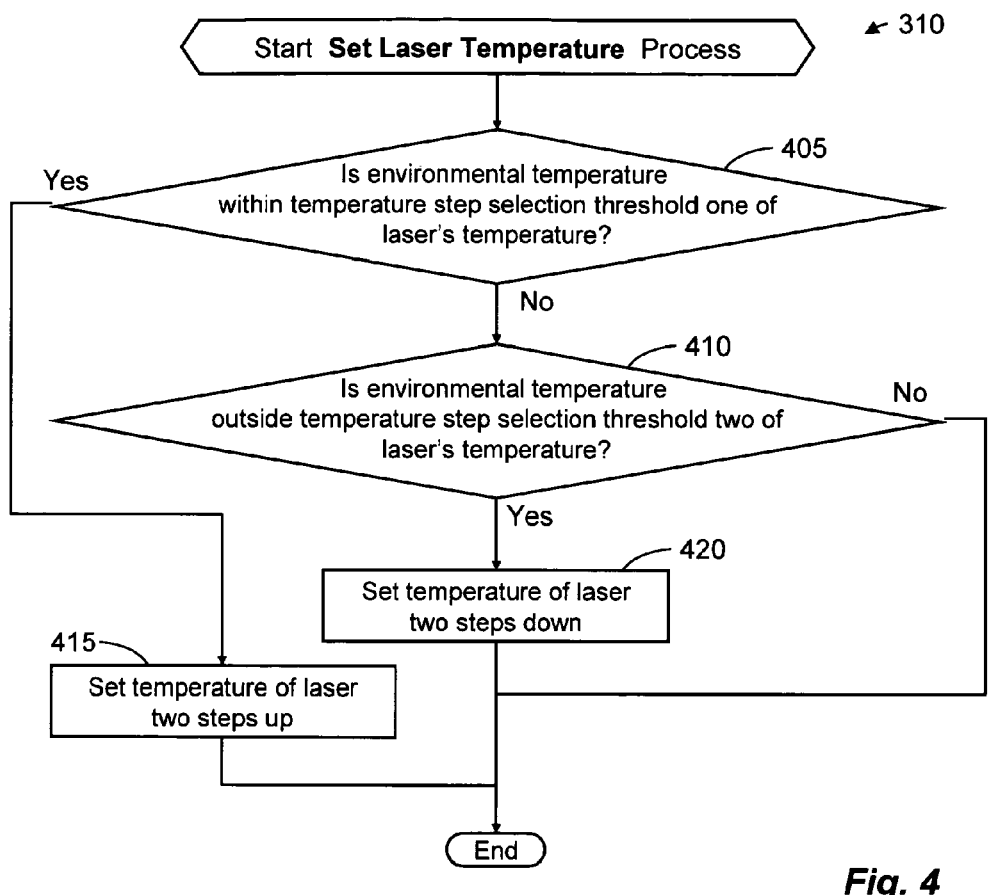
FIG. 4 is a flowchart of a process for setting laser temperature in accordance with certain exemplary embodiments of the present invention.
Figure 14:
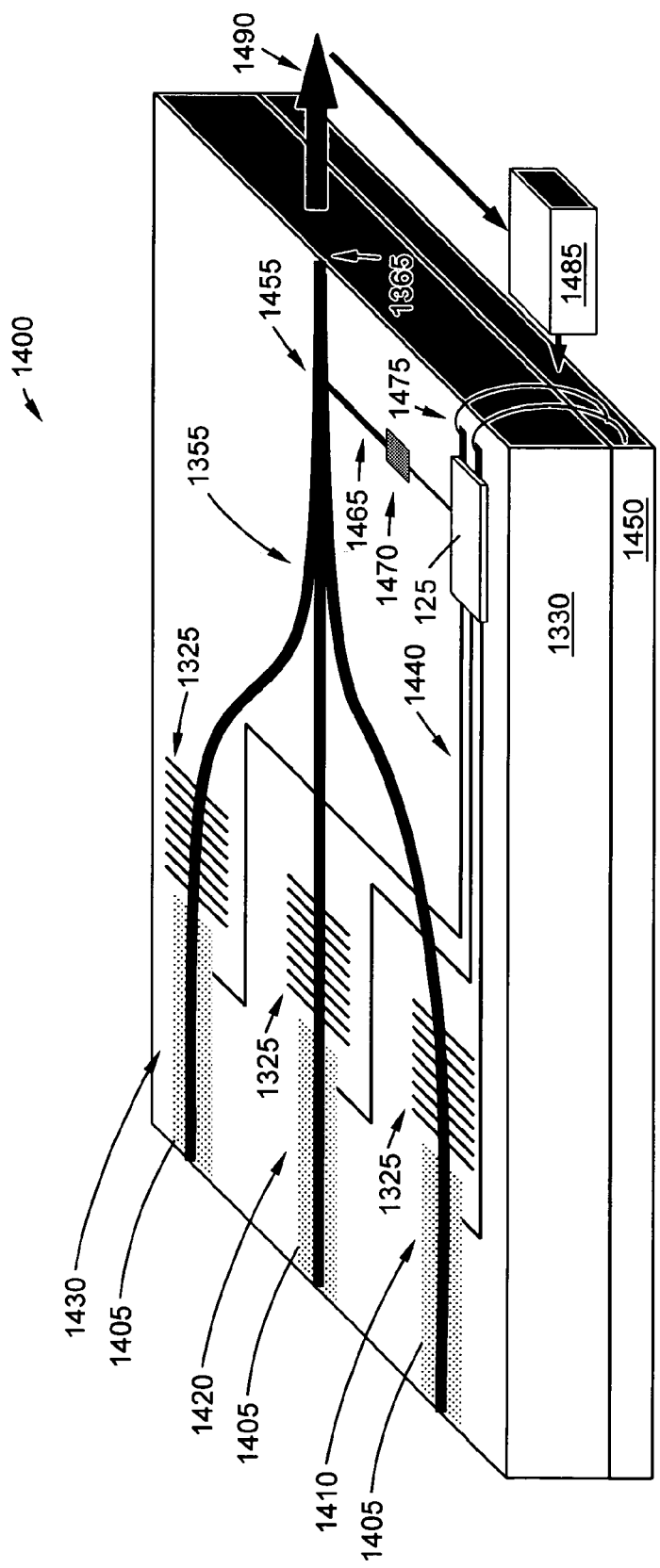
FIG. 14 is a perspective illustration of a lasing system comprising three redundant lasers formed as a monolithic structure in accordance with certain exemplary embodiments of the present invention.
Figure 15:
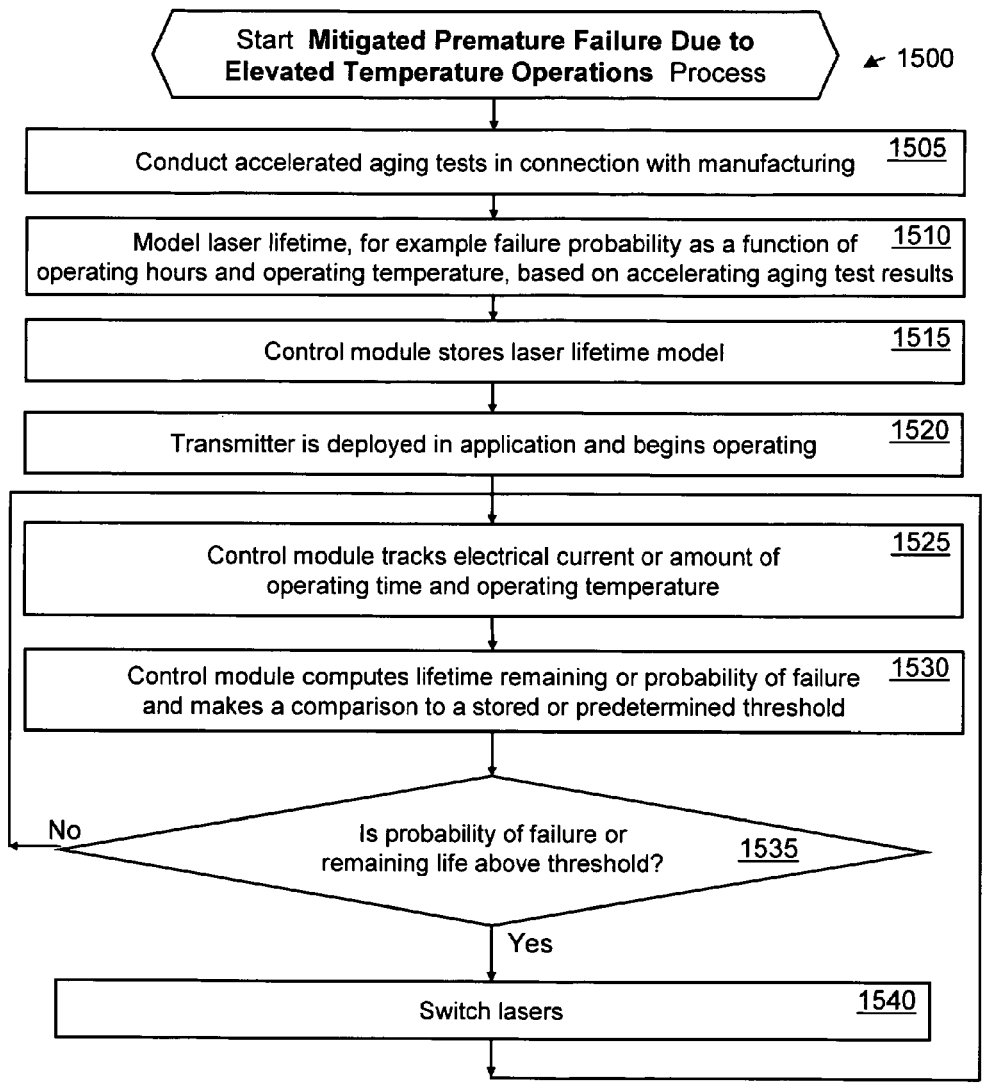
FIG. 15 is a flowchart of a process for operating lasers at elevated temperatures and switching lasers in advance of laser failure in accordance with certain exemplary embodiments of the present invention.

FIG. 1 illustrates an exemplary block diagram of certain embodiments that involve an optical communications operating environment. FIGS. 2A, 2B, and 12 illustrate exemplary plots describing representative characteristics associated with operations of certain embodiments. FIGS. 3 and 4 illustrate exemplary flowcharts regarding representative methods associated with operating certain embodiments. FIGS. 5A and 5B (collectively FIG. 5) illustrate exemplary packaging for certain embodiments. FIGS. 6, 7, 10, 11, and 13 illustrate exemplary lasers for certain embodiments. FIGS. 8 and 9 illustrate exemplary systems for feeding light from multiple lasers into a common optical waveguide in connection with certain embodiments. FIGS. 14 and 15 relate to switching lasers in advance of or in connection with premature laser failure associated with elevated temperature operations.

The present invention can be embodied in many different forms and should not be construed as limited to the embodiments set forth herein; rather, these embodiments are provided so that this disclosure will be thorough and complete, and will fully convey the scope of the invention to those having ordinary skill in the art. Furthermore, all "examples" or "exemplary embodiments" given herein are intended to be non-limiting, and among others supported by representations of the present invention.

Turning now to FIG. 1, this figure illustrates a functional block diagram of an exemplary optical communication system 102 according to certain embodiments of the present invention. In certain exemplary embodiments, each diagram element represents a specific or distinct device, subsystem, or grouping of elements. However, in other exemplary embodiments the functionalities illustrated in FIG. 1, as well as those disclosed elsewhere herein, can be dispersed or arranged in a variety of appropriate configurations.

Accordingly, those skilled in the art having benefit of this disclosure will appreciate that the division of the optical communication system 102 (as well as the other systems disclosed herein) into the illustrated functional blocks does not mean that every exemplary embodiment must have hard functional boundaries or rigid physical groupings of elements exactly as illustrated. In practice, functional blocks can be redrawn, combined, divided, repartitioned, or otherwise altered without deviating from the scope and spirit of the present invention.

The exemplary system 102 comprises a transmitter 100 that sends optical signals conveying information to the optical network 120. The transmitter 100 comprises a modulation circuit 135 for imprinting or encoding information on light via modulating laser light. As illustrated, the transmitter 100 encodes information via direct modulation. Alternatively, information may be encoded via external modulation, for example with a Mach-Zehnder interferometer, such as a lithium niobate modulator, or an electro-absorption modulator ("EAM"). The modulation circuit 135 can receive symbols, bits, characters, or some other form of analog or digital information and output corresponding current and/or voltage signals suitable for modulating information on laser light.

The transmitter 100 further comprises a case 150 which may be a housing, enclosure, package, or module. The case 150 contains two lasers, laser A 105 and laser B 110, that feed a signal combiner 115. The signal combiner 115 may be a directional coupler or other element that feeds light from whichever laser 105, 110 is active or engaged at any particular time to an optical waveguide that leads to the optical network 120.

The term "optical waveguide," as used herein, generally refers to a device or structure that directs, controls, or steers light to flow along a path, course, route, or channel and confines, limits, or binds the light so the light generally says on or in the path, course, route, or channel. An optical waveguide can comprise one or more structures that guide and/or generally confine light during transmission. For example, such an optical waveguide can comprise an elongate or elongated section of optical material that has high refractive index relative to an adjacent material, such as a cladding. In this configuration, the cladding helps keep the light on course. Another type of waveguide can comprise a material with a pattern of structures, such as holes, that help transmitting light maintain a prescribed course of travel without unwanted or excessive divergence or loss.

A control system 125 manages operations of the laser A 105 and the laser B 110 and includes a laser selector 130 that effectively switches between laser A 105 and laser B 110. Accordingly, the lasers 105, 110 can output, or otherwise provide, modulated light alternatingly. A control module 175 controls the laser selector 130, setting it to run and modulate laser A 105 or laser B 110 according to logic or determinations discussed below.

In certain exemplary embodiments, a solid state switch can comprise the laser selector 130. The laser selector 130 can comprise a transistor, a diode, a switching diode, an amplifier, etc. In certain exemplary embodiments, the laser selector 130 comprises a relay or other component that directs signal flow via physical motion, such as in connection with making, breaking, or moving contacts.

In certain exemplary embodiments, the laser A 105 and the laser B 110 will each receive power regardless of whether it has been selected. For example, the unselected (laser 105 or laser 110) may be placed in a standby mode or supplied sufficient current to be just above the lasing threshold. The signal from that unselected laser may by attenuated, for example (see the optical attenuators 517 illustrated in FIG. 5A and discussed below).

In certain exemplary embodiments, both of the lasers 105 and 110 may receive electricity whether selected or not, and a moving mirror, e.g. a micro electrical mechanical system ("MEMS") element, directs the light from the selected light for transmission over the optical network 120 while diverting light from the unselected laser. In certain exemplary embodiments, selecting one of the lasers 105 and 110 comprises engaging one of two external modulators, each associated with one of the lasers 105 and 110.

The control module 175 monitors ambient and/or environmental temperature via a case temperature sensor 180 and/or an external temperature sensor 185. In an exemplary embodiment, the case temperature sensor 180 can determine temperature of the case 150 or some other solid object near the case 150. In an exemplary embodiment, the external temperature sensor 185 can monitor temperature outside the case 150, such as an air temperature or temperature of some external housing or facility. Each of the case temperature sensor 180 and the external temperature sensor 185 can comprise a thermistor, a thermocouple, a restive thermal device, a digital thermometer, or some other appropriate facility for monitoring temperature, for example via outputting an electrical signal that indicates temperature.

As will be discussed in further detail below, the control module 175 uses input from one or both of the case temperature sensor 180 and the external temperature sensor 185 (or some other input) in support of controlling or regulating respective temperatures of the laser A 105 and the laser B 110.

The control module 175 outputs a temperature setpoint 108 to a temperature loop controller 115 that controls a heater 145 associated with the laser A 105 and another temperature setpoint 109 to another temperature loop controller 115 that controls another heather 145 associated with the laser B 110. In an exemplary embodiment, the control module 175 functions as a supervisory temperature controller with the temperature loop controllers 155 functioning as subordinate or local controllers. The control module 175 can be a master controller, while the temperature loop controllers 155 are slave controllers, for example. Thus, the control module 175 can output respective target temperatures to the temperature loop controllers 155 that maintain the lasers 105, 110 at the target temperatures. In the illustrated embodiment, each laser 105, 110 has an associated temperature sensor 107 that provides feedback to its respective temperature loop controller 155 in support of real-time or closed-loop temperature control.

The heaters 145 are exemplary devices for managing, regulating, or controlling individual temperatures of the laser A 105 and the laser B 110. As an alternative to heaters 145 outputting heat (or as an augmentation), the temperatures of the lasers 105, 110 can be regulated via active cooling, thermal electric cooling, Pelitier cooling, heat sinks, fans, manipulation of a thermal path, and/or some other appropriate heat management technology or apparatus. Although TECs may be detrimental to certain applications, they may benefit other applications or embodiments.

In certain exemplary embodiments, the laser A 105 and the laser B 110 can be standardized units. The lasers 105 and 110 can each be designed, engineered, and/or manufactured in accordance with the same specification. The lasers 105 and 110 can carry like or identical part numbers or identification codes (not withstanding that they may have different serial numbers). In certain exemplary embodiments, the laser A 105 and the laser B 110 are substantially identical to one another. In certain exemplary embodiments, the only differences between the laser A 105 and the laser B 110 arise from manufacturing tolerances (and perhaps serial numbers, tracking numbers, and/or labeling information).

In various exemplary embodiments, the lasers 105 and 110 can be or can comprise DFB lasers, DBR lasers, fiber-Bragg grating lasers, silicon lasers, Fabry-Perot lasers, injection lasers, VCSELs, fiber lasers, Raman lasers, semiconductor lasers, mono-mode lasers, single-mode lasers, mode-locked lasers, external cavity lasers, extended cavity lasers, multiple quantum well ("MQW") lasers, lasers that comprise a capped mesa buried hetero-structure ("CBMH") grown on an n-type substrate with MQW active layers and a DFB grating layer, diode lasers, quantum dot lasers, quantum dash lasers, silicon lasers, "silicon-photonic" lasers, optical pumped lasers that can comprise silicon, compound semiconductor lasers, strained quantum well lasers, edge emitting lasers, frequency doubling lasers, separate confinement hetrostructure quantum well lasers, buried hetrostructure diode lasers, quantum cascade lasers, multi-mode lasers, lasers that lase at multiple longitudinal modes, or lasers that lase at multiple transverse modes as appropriate (not an exhaustive list).

Moreover, the lasers 105 and 110 can be substituted for light emitters, light processing devices, or light processors that are influenced by temperature or that respond to a temperature shift with a change in at least one characteristic of the light emitted. In certain exemplary embodiments, temperature sensitivity impacts or influences the efficiency at which an optoelectronic light emitting device converts electrical energy into photonic energy. In certain exemplary embodiments, such a device can comprise a diode that emits light other than laser light, for example a light emitting diode. In accordance with certain exemplary embodiments, such a device can emit light that has a coherency below that normally associated with laser light. In certain exemplary embodiments, devices that may be substituted for the lasers 105 and 110 can comprise optoelectronic material or electro-optic material, for example.

In certain exemplary embodiments, at least one of the lasers 105 and 110 comprises an optically pumped silicon laser, for example operating based on Raman scattering. Further, each of the lasers 105 and 110 can comprise a silicon-based gain material, optically pumped or energized via electricity. Accordingly, the lasers 105, 110 can comprise silicon photonic implementations.

In certain exemplary embodiments, each of the lasers 105, 110 comprises a material platform for operating at about 1310 nm or 1550 nm. Such material platform may comprise InP—InGaAsP or GaAs—InGaAsN, for example.

In certain exemplary embodiments, the lasers 105, 110 comprise gallium aluminum arsenide for short wavelength operation or indium gallium arsenide phosphide ("InGaAsP") for long wavelength operation. In certain exemplary embodiments, one or both of the lasers 105, 110 comprises indium phosphide (InP) that can be adapted to provide a tailored gain profile.

In one exemplary embodiment, at least one of the lasers 105, 110 comprises InAs/InP. In one exemplary embodiment, at least one of the lasers 105, 110 comprises InGaAsP/InP. In one exemplary embodiment, at least one of the lasers 105, 110 comprises a MQW laser diode. In one exemplary embodiment, at least one of the lasers 105, 110 comprises InGaAsP/InP. In one exemplary embodiment, at least one of the lasers 105, 110 comprises a MQW DFB laser. In one exemplary embodiment, at least one of the lasers 105, 110 comprises InGaAsP/InP. In one exemplary embodiment, at least one of the lasers 105, 110 comprises a MQW DBR laser. In one exemplary embodiment, at least one of the lasers 105, 110 comprises GaAs. In one exemplary embodiment, at least one of the lasers 105, 110 comprises GaAs/AlGaAs. In one exemplary embodiment, at least one of the lasers 105, 110 comprises AlInGaAs. In one exemplary embodiment, at least one of the lasers 105, 110 comprises InGaAsP. In one exemplary embodiment, at least one of the lasers 105, 110 comprises InGaAs material and quantum dots. In one exemplary embodiment, at least one of the lasers 105, 110 comprises GaInN(Sb)As. In one exemplary embodiment, at least one of the lasers 105, 110 comprises AlGaAsSb. In one exemplary embodiment, at least one of the lasers 105, 110 comprises InP base material with InGaAsP layers manufactured by molecular beam epitaxy ("MBE") or metal organic chemical vapor deposition ("MOCVD"). In one exemplary embodiment, at least one of the lasers 105, 110 is a VCSEL comprising AlGaAs and operating in an 850 nm region of the light spectrum. In one exemplary embodiment, at least one of the lasers 105, 110 comprises a distributed feedback laser comprising InP and operating in a 1550 nm region of the light spectrum, for example in the region in which fiber optic light attenuation associated with water absorption dips to a local minimum. In one exemplary embodiment, at least one of the lasers 105, 110 comprises a distributed feedback laser comprising InP and operating in a 1310 nm region of the light spectrum, for example in the region in which fiber optic light attenuation associated with water absorption dips to a local minimum. In one exemplary embodiment, at least one of the lasers 105, 110 comprises a strained quantum well laser comprising InGaAs operating in a 905 nm region of the light spectrum. In certain exemplary embodiments, both of the lasers 105, 110 comprise one of the laser technologies or materials described in this paragraph. Further, the lasers 105, 110 can comprise appropriate combinations of the material systems or technologies discussed in this paragraph.

Certain exemplary lasing material systems can comprise selected combinations of the following materials: InGaAsP (1-1.8 microns), GaAsSb (1-1.6 microns), AlGaAs (0.7-0.9 microns), GaAsP (0.6-1 microns), AlGaInP (0.6-0.7 microns), InGaAs (0.6-3 microns), GaInN (0.35-0.7 microns), and/or CdZnS (0.3-0.5 microns), for example.

Turning now to FIG. 2A, this figure illustrates an exemplary graph 200 of laser temperatures and environmental temperature over time according to certain embodiments of the present invention. The graph 200 includes a plot 205 of environmental temperature, a plot 215 of temperature of laser A 105, a plot 210 of temperature of laser B 110, and a trace 250 indicating which laser is selected for running over time. FIG. 2A and the other plots and graphs provided here are based on simulated results rather than presenting data from laboratory testing of a specific embodiment of the present invention.

The environmental temperature plot 205 depicts a fluctuating temperature to which the laser A 105 and the laser B 110 are subjected. In certain embodiments, the environmental temperature plot 205 can represent changing temperature of a housing, case, box, rack, panel, cabinet, drawer, card, blade, enclosure, package, or other appropriate system in which the lasers 105 and 110 are disposed. In certain exemplary embodiments, the plot 205 can represent temperature changes of a surface, item, member, or solid object disposed near the lasers 105 and 110 or collocated with the lasers 105 and 110. In certain exemplary embodiments, the plot 205 can represent temperature variations of a gaseous material, such as air, near or adjacent the lasers 105 and 110. The plot 205 can represent ambient temperature or temperate of a surrounding or adjacent area.

In certain exemplary embodiments, the plot 205 can represent varying temperature of a structure, mount, member, bracket, or facility upon which a communication device is mounted, wherein the communication device comprises the lasers 105 and 110. For example, such a communication device could be or comprise an optical access terminal, a fiber-to-the-home ("FTTH") interface, or an interface for fiber-to-the-curb (FTTC), fiber-to-the-node, fiber-to-the-business ("FTTB"), fiber-to-the-whatever ("FTTX"), fiber-to-the-building ("FTTB"), fiber-to-the-premises ("FTTP"), fiber-to-the-desktop ("FTTD"), etc. The plot 205 could represent temperature of a surface of such a communication device or some other surface associated therewith.

In certain exemplary embodiments, the plot 205 can represent temperature that changes randomly, in a manner that is generally unpredictable or nondeterministic, in an unplanned fashion, without definite aim or pattern, indeterministically, in a pattern substantially described by probably distribution, or with a substantially stochastic characteristic. In certain exemplary embodiments, the temperatures of the plot 205 can comprise a randomly determined sequence of observations, each of which is considered as a sample of an element from a probability distribution. In certain exemplary embodiments, the plotted temperature can follow a path, trajectory, or course that is unknown a priori.

The plotted temperature can evolve along an unpredictable path or one in which temperature can not be predicted exactly. The plot 205 can describe temperature of a probabilistic system wherein the temperature cannot be predicted exactly but the probability of certain temperature behaviors, constraints, or patterns may be known (for example it might be known that temperature is likely to fall at night or in winter). Further, in certain exemplary embodiments, temperature may trend in a prevailing direction or with a tendency while avoiding precise prediction, for example in keeping in the manner that weather often is forecasted by a meteorologist or statistically.

In certain exemplary embodiments, the plotted temperature can be influenced by a machine or system that may have a controlled or regulated temperature. For example, the lasers 105 and 110 can be mounted in a room of a dwelling (or in a computer room or an equipment cabinet) that is air conditioned and heated, but varies randomly nonetheless. In this situation, the temperature of the plot 205 can swing randomly, but less extremely than the air temperature outside the dwelling, for example.

As yet another example, the lasers 105 and 110 can be mounted near an electrical system (such as a circuit board, an amplifier, a modem, a microprocessor system, a computer, a router, etc.) that emits heat intermittently, perhaps under computer control or in connection with regulating the system's temperature. In this example, the plot 205 can represent fluctuating temperatures impacted by the electrical system, with the electrical system amplifying, suppressing, subduing, or insulating other temperature swings having a random characteristic.

Temperature variations can further result from effects or events that may be seasonal; weather driven or weather related; related to or driven in part by wind, sun, rain, or cycles of day and night; load, duty cycle, or utilization of an adjacent or collocated device that is powered by electricity; or associated with occupancy, to name a few representative possibilities.

The previous sentence (which is a paragraph) of alternatives; like all other presented lists and descriptions of variations and alternatives, and similar sentences and paragraphs provided herein; is not exhaustive, is not limiting, and is provided in the context of describing representative examples and variations supported by certain exemplary embodiments of the present invention. Accordingly, those of ordinary skill in the art having benefit of this disclosure will appreciate that the present invention is not constrained by any such lists, examples, or embodiments presented herein. Moreover, the disclosure of lists, examples, embodiments, and the like will help guide those or ordinary skill in practicing many more implementations and instances of the present invention without undue experimentation, all of which are intended to be within the scope of the claims that follow.

In certain exemplary embodiments, the temperature variations of the environment can be so substantial as to interference with (or disrupt) operation of the lasers 105 and 110 to an extent that would render those operations substantially unsuitable for an intended operation, if not for the benefit of the present technology.

In certain exemplary embodiments, the transmitter 100 has a temperature that floats or substantially floats with respect to an operating environment. For example, the transmitter 100 may be disposed in a communications or telecommunications enclosure that is subjected to outdoor temperature without benefit of active cooling. Such an operating environment can experience temperature swings between −20° C. and 60° C. or between −40° C. and 60° C., for example. The transmitter 100 can be rated for service in operating conditions of −20° C. to 60° C. or −40° C. to 60° C. without active cooling. That is, the transmitter 100 can be specified for −20° C. to 60° C. outdoor service, −40° C. to 60° C. outdoor service, −40° C. to 60° C. ambient conditions, and/or −20° C. to 60° C. ambient conditions. Accordingly, the plot 205 and/or the graph 200 can represent a maximum temperature of 60° C. and a minimum of −20° C. or −40° C. (or other appropriate minimum and maximum temperatures), for example.

The plot 215 describes an exemplary temperature course or track of the laser A 105 over time, as the environmental temperature fluctuates. As illustrated, the temperature of the laser A 105 tracks (or generally follows) the fluctuating environmental temperature in steps, as controlled by the control module 175 and the temperature loop controller 155 associated with the laser A 105. The line of the plot 215 has the longest dashes on FIG. 2A.

Similarly, the plot 210 describes an exemplary temperature course or track of the laser B 110 over time, as the environmental temperature fluctuates. As illustrated, the temperature of the laser B 110 tracks (or generally follows) the fluctuating environmental temperature in steps, as controlled by the control module 175 and the temperature loop controller 155 associated with the laser B 110. The line of the plot 210 has dashes that are shorter than the dashes of the plot 215. In the illustrated exemplary embodiment, the each of the lasers 105 and 110 follows a distinct temperature course while tracking or generally following environmental temperature.

With each of the lasers 105 and 110 having a temperature that tracks the environmental temperature while remaining above the environmental temperature, the lasers 105 and 110 can have a prolonged operating life as compared to attempting to operate above the maximum temperature of the environment. And, regulating temperature of the lasers 105 and 110 facilitates outputting light having a wavelength that is compatible with DWDM (or CWDM or WDM) or that is aligned to a coordinate of a DWDM grid or that is in a predefined wavelength or frequency band. (Nevertheless, some applications and exemplary embodiments may derive benefit from active cooling, such as via thermal electric cooling)

Those skilled in the art will appreciate that the plots 210 and 215 may include temperature dynamics, transients, oscillations, decays, and short-term variations (for example as can be represented by various decaying exponential functions and sine waves) that are not included in FIG. 2A. Thus, any short-term variations in temperature that may result from the temperature loop controllers 155 dynamically controlling respective temperatures of the laser A 105 and the laser B 110 have been suppressed from the graph 200 to benefit the illustration and to help describe certain principles of exemplary embodiments of the present invention. Thus, the plots 210 and 215 illustrate representative macro temperatures changes rather than minute temperature variations that may occur, for example within a dead band or in connection changing temperature setpoints.

The trace 250 illustrates which of the laser A 105 and the laser B 110 is selected and/or running. That is, the trace 250 describes an exemplary embodiment of the laser selector 130 switching between the laser A 105 and the laser B 110 under control of the control module 175.

The line of the trace 250 is dotted to help distinguish that line from the lines of the plots 215 and 210. Also, the trace 250 is slightly offset from (raised above) the plots 215 and 210 as a visual aid to help distinguish the respective lines from one another. This slight offset is not intended to suggest any temperature deviation. In other words, in an exemplary embodiment, the trace 250 overlays or is superimposed upon the plot 210 or the plot 215 at various times. (Nevertheless, the selected laser may undergo some temperature deviation, e.g. an increase, in connection with being selected, switched on, modulated, or operated.)

The graph 200 further illustrates multiple temperature steps 220. In certain exemplary embodiments, each of the steps 220 represents an operating regime that supports achieving a light processing result. In certain exemplary embodiments, each of the steps 220 supports an optical device operating in a substantially like manner in each step. In certain exemplary embodiments, a device, element, or feature can process light in a like manner at multiple ones of the steps 220.

In certain exemplary embodiments, the laser A 105 and the laser B 110 can each output light complying with a wavelength specification at each of the steps 220. Such an embodiment will be discussed in further detail below, including with respect to FIG. 2B.

The steps 220 are separated from one another by a temperature difference 245 or span a temperature difference 245. Further, each step 220 can substantially comprise the temperature difference 245. In certain exemplary embodiments, the each of the steps 220 has substantially the same temperature difference 245. In certain exemplary embodiment, the temperature difference 245 varies. For example, the temperature steps 220 can be progressively higher (or lower) for increased temperature, or as a result of some other influence, operating parameter, or stimulus.

FIG. 2A further illustrates exemplary temperature thresholds that the control module 175 uses in connection with setting respective temperatures of the laser A 105 and the laser B 110 and to select which one of the lasers 105 and 110 is running or providing modulated light at any specific time.

As discussed in further detail below, the temperature step selection threshold one 235 exemplifies a temperature difference between the environmental temperature (plot 205) and the laser temperature (plots 210 and 215) that triggers the control module 175 to increase laser temperature (such as by two steps 220). The temperature step selection threshold two 240 exemplifies a temperature difference between the environmental temperature (plot 205) and the laser temperature (plots 210 and 215) that triggers the control module 175 to decrease laser temperature (such as by two steps 220). In the illustrated exemplary embodiment, the temperature step selection threshold one 235 is smaller than the temperature step selection threshold two 240.

The laser selection threshold one 225 exemplifies a temperature difference between the environmental temperature (plot 205) and the laser temperature (plots 210 and 215) that triggers the control module 175 to switch lasers (e.g. via the laser selector 130). The laser selection threshold two 230 exemplifies another temperature difference between the environmental temperature (plot 205) and the laser temperature (plots 210 and 215) that triggers the control module 175 to switch lasers (e.g. via the laser selector 130). In the illustrated exemplary embodiment, the laser selection threshold one 225 is smaller than the laser selection threshold two 230.

Turning now to FIG. 2B, this figure illustrates an exemplary plot 255 of wavelength of a laser as a function of temperature according to certain embodiments of the present invention. In an exemplary embodiment, FIG. 2B illustrates wavelength of the laser A 105 and/or the laser B 110 across a range of temperatures, and will be discussed in such an exemplary context.

As depicted in FIG. 2B, with increasing laser temperature, wavelength increases linearly and then abruptly changes. The linear increases and abrupt changes repeat cyclically across a range of temperatures to provide a plot 255 generally resembling a triangle or saw-tooth waveform. Thus, the plot 255 includes multiple linear segments with abrupt changes 270 between each linear segment. In certain exemplary embodiments, each abrupt change 270 can comprise a substantial discontinuity. In certain exemplary embodiments, each abrupt change 270 can comprise or result from a "mode hop," and such an embodiment will be described in further detail below. In the exemplary plot 255, each linear segment corresponds to the temperature difference 245. Each of the temperature steps 220 illustrated in FIG. 2A and discussed above can be disposed in, span, or comprise a respective one of the linear segments. Accordingly, the temperature steps 220 can provide respective operating points of substantially like wavelength 265 within a region of linear operation. And, each temperature step 220 can provide a specific temperature 260 that supports the wavelength 265.

In certain exemplary embodiments, the specific temperature 260 aligns the wavelength 265 to a DWDM channel 275. Moreover, the wavelength 265 can be in a DWDM channel 275. Accordingly, the laser A 105 and the laser B 110 can each conform to or comply with a wavelength specification for DWDM (or CWDM or WDM) at multiple operating temperatures or in multiple operating regimes. The control system 125 manages the lasers 105 and 110 so that each is prepared to meet such a specification at the same time. With both lasers 105 and 110 prepared for meeting a specification, the control system 125 can select either for operation.

In certain exemplary embodiments, the plot 255 can exhibit hysteresis, memory effects, a generally upward trend, a generally downward trend, nonlinearities, skewing, sloping, transients, distortion, and/or other variations not illustrated in FIG. 2A. For example, mode hops may occur at different temperature locations according to whether temperature is increasing or decreasing.

In accordance with certain exemplary embodiments, FIG. 12 (discussed below) provides additional information relevant to FIG. 2B, as will be discussed above. According to certain exemplary embodiments, FIGS. 2B and 12 can be companions to one another.

Turning now to FIG. 3, this figure illustrates a flowchart of an exemplary process 300 for operating lasers according to certain embodiments of the present invention. In an exemplary embodiment, the process 300, which is entitled "Operate Lasers," can involve an embodiment in accordance with FIGS. 1, 2A, and 2B and thus will be discussed below with exemplary reference to those figures.

As will be discussed in further detail below, in certain exemplary embodiments, the control module 175 can execute certain steps of process 300, or process 300 can comprise certain steps executed on, implemented by, or supported through the control module 175 and/or the control system 125. Accordingly, the control module 175 can comprise circuitry, logic, memory, and/or one or more digital controllers for storing and executing instructions, for example.

In certain exemplary embodiments, in support of storing and operating instructions, the control module 175 can comprise a microprocessor (not shown), a digital processor, or other circuitry. Further, the control module 175 can comprise other digital circuitry such as flash memory, random access memory ("RAM"), a digital-to-analog converter ("DAC"), an analog-to-digital converter ("ADC"), etc. Flash memory can support software revisions or upgrades transmitted over the optical network 120 to a receiver (not illustrated) associated with the transmitter 100. The control module 175 can utilize RAM for data storage and program execution. An ADC can digitize inputs, such as temperature signals. Further, signals (e.g. temperature signals, digital signals, outputs, etc.) can be filtered to damp, smooth, or average high-frequency variation.

A DAC can generate control voltages or currents that manipulate, manage, or control the heaters 145, the laser selector 130, and/or the lasers 105, 110. The control module 175 can further comprise one or more timers for managing pulses, measuring time between signal events, or synchronizing actions, for example.

The control module 175 can connect to, comprise, or otherwise access assorted types of memory that may hold instructions. Such memory can include any one or combination of volatile memory elements (e.g., forms of RAM such as DRAM, SRAM, SDRAM, etc.), nonvolatile memory elements (e.g., ROM, hard drive, tape, compact disc read-only memory ("CDROM"), etc.), and erasable memory (e.g. erasable programmable read only memory ("EPROM") and electrical EPROM ("EEPROM")). Moreover, the control module 175 may incorporate electronic, magnetic, optical, and/or other types of storage media and can have a distributed architecture, where various components are situated remote from one another, but can be accessed over a network. Instructions and/or code for operating the gain control module 175, including routines associated with the process 300, can be stored in a computer-readable medium.

A "computer-readable medium" can be any means that can store, communicate, propagate, or transport a program for use by or in connection with an instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection (electronic) having one or more wires, a portable computer diskette (magnetic), a RAM (electronic), a read-only memory ("ROM") (electronic), an erasable programmable read-only memory (EPROM, EEPROM, or Flash memory) (electronic), a data stick, a flash drive, and a portable CDROM (optical). Note that a computer-readable medium could even be paper or another suitable medium upon which the program is printed, as the program can be electronically captured, via for instance optically scanning the paper or other medium, then compiled, interpreted or otherwise processed in a suitable manner if necessary, and then stored in a computer memory.

In certain exemplary embodiments, the gain control module 175 can include logic implemented in hardware with any or a combination of the following technologies: a discrete logic circuit(s) having logic gates for implementing logic functions upon data signals, an application-specific integrated circuit ("ASIC") having appropriate combinational logic gates, a programmable gate array(s) ("PGA"), a field programmable gate array ("FPGA"), etc.

It should be apparent that one of ordinary skill in the art would be able to make and operate the control module 175 and the process 300 (as well as the other items described herein associated with exemplary embodiments of the present invention) without difficulty and without undue experimentation based on the figures, illustrations, exemplary functional block diagrams, flow charts, and associated descriptions in the application text, for example. Therefore, additional disclosure of a particular set of program code instructions or more particularized circuit schematics for the gain control module 175 is not considered necessary for an adequate understanding of how to make and use the present invention.

Certain steps in the processes and methods described below (and elsewhere herein) may naturally need to precede others for the present invention to function as described. However, the present invention is not limited to the order of the steps described if such order or sequence does not adversely alter the functionality of the present invention to the extent of rendering the invention inoperable. That is, it is recognized that some steps may be performed before or after other steps or in parallel with other steps without departing from the scope and spirit of the present invention.

At step 305 of process 300, the control module 175 initializes the lasers 105 and 110 or sets their temperatures to respective starting points. The control module 175 determines the temperature of the operating environment based on a temperature signal supplied by the case temperature sensor 180 or the external temperature sensor 185 or both of those sensors 180 and 185. The control module 175 determines temperature setpoints 108 and 109 for the respective temperature controllers 155 of the laser A 105 and the laser B 110 according to temperature of the operating environment as sensed, estimated, computed, measured, or otherwise determined.

The initial temperature setpoint for the laser A 105 is one temperature step 220 above the temperature of the operating environment. The initial temperature setpoint for the laser B 110 is two temperature steps 220 above the temperature of the operating environment. The temperature loop controllers 155 control the respective temperatures of the laser A 105 and the laser B 110 according to these initial setpoints. The left-hand side of the graph 200 illustrates a representative example of such an initialization. (See the areas of the plots 205, 210, 215, and 250 above the reference number 202.)

At step 310, updated temperatures for each of the laser A 105 and the laser B 110 are computed and implemented. FIG. 4 illustrates a flowchart for an exemplary method or process for implementing step 310, in the form of a subroutine entitled "Set Laser Temperature." (More generally, FIG. 4 illustrates a flowchart of an exemplary process 310 for setting laser temperature according to certain embodiments of the present invention.) Accordingly, the step 310 may be referred to as "process 310" below, when deemed beneficial for this explanation in the context of this discussion. As discussed below, process 310, which is likewise entitled "Set Laser Temperature," executes for each of the lasers 105 and 110.

Referring now to FIG. 4, at decision step 405 of process 310, the control module 175 compares the environmental temperature (see plot 205) with the temperature of the laser for which process 310 is executing. (Process 310 runs for the laser A 105 and again for the laser B 110. The laser to which execution is directed can be referred to as the "subject laser" in this explanation.) The control module 175 determines whether the subject laser's temperature is above the environmental temperature by an amount that is less than the temperature step selection threshold one 235.

Such a determination may proceed by subtracting the subject laser's temperature from the environmental temperature or otherwise computing a difference. (The temperature sensor 107 or the appropriate temperature setpoint 108 or 109 can provide laser temperature information, while the case temperature sensor 180 or the external temperature sensor 185 can provide environmental temperature information.) If the result of the subtraction is less than the temperature step selection threshold one 235, then the inquiry is positive; otherwise, the inquiry is negative.

If the control module 175 makes a determination at inquiry step 405 that environmental temperature is within the temperature step selection threshold one 235 of the subject laser's temperature, then step 415 executes following step 405. Otherwise, process 310 proceeds to inquiry step 410.

At step 415, the control module 175 sets the temperature of the subject laser two temperature steps 220 above its current temperature. For example, see the region of the graph 200 above the reference number 202. As shown by the plot 215, the laser A 105 has a temperature indicated by the reference number 203 (for example per a value of the temperature setpoint 108). As shown in the plot 205, the environmental temperature increases towards the temperature 203. At the reference number 204, the difference between the environmental temperature and the temperature 203 of the laser A 105 becomes less than the temperature step selection threshold one 235. When this criterion is met, the control module 175 increases the temperature of the laser A 105 by two temperature steps (for example twice the temperature difference 245), so that the temperature of the laser A 105 increases and settles to the temperature indicated by the reference number 206. (See the step change in the plot 215 under the reference number 204.)

Following execution of step 415, process 310 ends, and execution of process 300 proceeds with step 315 as will be discussed below. In other words, execution flow returns to process 300 following subroutine execution.

If the control module 175 determines at step 405 that the environmental temperature is not within the temperature step selection threshold one 235 of the laser's temperature, then process 310 executes inquiry step 410 rather than step 415.

At inquiry step 410, the control module 175 determines whether the environmental temperature is outside the temperature step selection threshold two 240. Implementation of step 410 can comprise the control module 175 determining whether the difference between the environmental temperature and the subject laser's temperature (or its temperature setpoint, see reference number 108 or 109 on FIG. 1) is greater than the temperature step selection threshold two 240.

If the determination of step 410 is positive, then process 310 proceeds to step 420. At step 420, the control module 175 sets the temperature of the subject laser two temperature steps 220 down (to a lower temperature). As discussed above, reducing the subject laser's temperature typically comprises feeding a lower temperature setpoint (108 or 109) to the appropriate temperature loop controller 155. In certain exemplary embodiments, the appropriate heater 145 reduces the rate of heat addition to the subject laser. Alternative, or additionally, achieving the temperature setpoint (108 or 109) can comprise changing the rate of heat removal from the subject laser.

The portion of the graph 200 above the reference number 211 illustrates an example for steps 410 and 420. In this area 211, the laser B 110 has a regulated temperature as indicated by the reference number 212. (See the plot 210, which is the line with the short dashes.) As time proceeds, the environmental temperature (see the plot 205) decreases. The downward trend in environmental temperature results in an increase in the temperature difference between the environmental temperature and the temperature 212 of the laser B 110. When this difference exceeds the temperature step selection threshold two 240, the control module 175 reduces the temperature of the laser B 110 by two temperature steps 220. (See the reference number 213.) When the temperature of the laser B 110 settles, the laser B 110 has a temperature as indicated by the reference number 214.

On the other hand, if inquiry step 410 results in a negative determination, process 310 follows the "no" branch, ends, and returns execution to process 300. Via executing process 310 for each of the laser A 105 and the laser B 110, each laser 105, 110 tracks fluctuations in environmental temperature. In accordance with the illustrated embodiment, each laser 105, 110 follows a different track, course, or path that can be elevated above the environmental temperature.

In certain exemplary embodiments or during certain time frames, the two lasers 105, 110 may have substantially like, similar, or identical temperatures. In certain exemplary embodiments, the control module 175 may constrain the maximum laser temperature to avoid subjecting the subject laser to extreme or unnecessarily high temperatures. For example, if the transmitter 100 was rated for the maximum temperature indicated by the reference number 226, then the control module 175 could impose a temperature constraint at the temperature indicated by the reference number 227. In this situation, the control module would set the temperature of the laser B 110 at the temperature 226 at a time as indicated by the reference number 228, rather than at the temperature 229 that the graph 200 illustrates.

As an alternative to process 310, the control module 175 can manage or regulate temperature of the lasers 105 and 110 by other appropriate methods. For example, in certain exemplary embodiments, the temperature of the laser A 105 is regulated so as to be one step above the environmental temperature, and the temperature of the laser B 110 remains two steps above the environmental temperature.

In certain exemplary embodiments, the transmitter 100 may comprise three, four, or more lasers. The control module 175 can control each of such lasers to track the environmental temperature individually, resulting in three or more distinct temperature tracks. In certain embodiments, the temperature of two or more lasers can be commonly controlled, so that they follow substantially the same path. Two lasers can follow one track (for example as indicated by the plot 215 of FIG. 2A, while two other lasers follow a distinct track (for example as indicated by the plot 210 of FIG. 2A). In this manner, the lasers following each track can provide redundancy with respect to one another, for example. Additional disclosure and teachings relevant to such embodiments will be provided below with reference to FIGS. 14 and 15.

Further, in certain exemplary embodiments, two lasers following one track can have different gain profiles, each optimized for operation across a different temperature span. The control module 175 can activate a laser optimized for low-temperature performance when the environmental temperature is low and can activate a laser optimized for high-temperature performance with the environmental temperature is high. Accordingly, the control module 175 can select and operate lasers having characteristics that are matched with, optimized for, or otherwise suited to monitored environmental parameters and/or fluctuating operating conditions.

Referring now back to FIG. 3, in accordance with the illustrated exemplary flowchart, process 300 continues following execution of process 310 for each of the lasers 105 and 110 (as step 310 of process 300). Process 300 thus proceeds with execution of inquiry step 315 following step/process 310.

At inquiry step 315, the control module 175 determines whether either of the lasers 105 and 110 is running. If neither the laser A 105 nor the laser B 110 is running, then the transmitter 100 initiates running of laser A 105 at step 320. Accordingly, step 320 can be viewed as an exemplary initialization whereby laser A 105 is the first laser selected for running. The graph 200 illustrates an example of such a scenario in the area generally above the reference number 202, at the start of the trace 250 (dotted line).

Inquiry step 325 follows execution of step 315 or step 320, as appropriate, where process 300 proceeds to steps 325, 330, and 335 to select laser A 105 or laser B 110 for running. At step 325, the control module 175 determines whether the environmental temperature is within the laser selection threshold one 225 of the temperature of the active or running laser. For example, the control module 175 determines whether the difference between the temperature of the selected laser, which typically is running or active, and the environmental temperature is less than the laser selection threshold one 225.

Referring to the area of the graph 220 above the reference number 202 and as indicated by the trace 250 (dotted line) the laser A 110 is the laser initially selected for running or being active. As time proceeds, environmental temperature trends upward, as indicated by the plot 205, while temperature of the laser A 110 remains substantially constant, as indicated by the plot 215. As discussed above, when the temperature of laser A 110 is within a threshold distance of the environment temperature, the control module 175 increases that laser temperature by two steps 220. (See reference number 204). However, in the illustrated exemplary embodiment, the laser selection threshold one 225 is larger than the temperature step selection threshold one 235. Accordingly, in advance of meeting a condition for implementing a step change in laser temperature, the difference between the environmental temperature and the temperature of the laser A 105 becomes less than the laser selection threshold one 225. This condition triggers a positive determination at inquiry step 325.

As shown by the trace 250 (specifically the portion of the trace 250 adjacent the lead line for the reference number 250), the positive determination at step 325 branches execution of process 300 to step 335. At step 335, the control module 175 prompts the laser selector 130 to switch lasers. In the area of the graph 200 above the reference number 202, the laser B 110 switches on, starts running, initiates modulation, becomes active, is activated, or otherwise changes states or modes. Meanwhile, the laser A 105 switches off, stops running, ceases or suspends modulation, becomes inactive, is deactivated, or otherwise changes states or modes. Following step 335, process 300 loops back to step 310 and continues therefrom, for example in an iterating fashion. The laser B 110, having the temperature indicated by the reference number 212, picks up operations. As discussed above, the laser B 110 can provide a substantially similar result operating at the temperature 212 as the laser A 105 provided while operating at the temperature 203.

In certain exemplary embodiments, step 335 comprises a process proceeding in accordance with the below steps, which are described from the perspective of switching between two arbitrary lasers that will be referred to as the laser I and the laser II. The lasers I and II can correspond to the lasers 105 and 110 discussed above.

In advance of the switch, the laser I is active and emitting modulated light for transmission over the optical network 120, while power is substantially removed from the deactivated laser II;

the control module 175 engages a variable optical attenuator (e.g. see the optical attenuator 517 illustrated in FIG. 5A and discussed below) associated with the deactivated laser II to move that attenuator to a state of high attenuation;

the control module 175 supplies power to the laser II, moving it from a deactivated state to a state of emitting lasing light;

under supervision by the control module 175, the laser selector 130 initiates modulation of the lasing light of the laser II (while modulation of the light from laser I may continue);

operation of the laser II stabilizes;

a variable optical attenuator (see FIG. 5A and accompanying discussion) associated with the laser I begins attenuating the modulated light of the laser I;

using power monitoring by optical power monitors (such as the detectors 530 illustrated in FIG. 5A and discussed below) as feedback, the control module 175 manipulates the variable optical attenuators to gradually decrease optical power from the laser I while gradually increasing optical power from the laser II, so the composite modulated intensity from the laser I and the laser II can remain substantially uniform or constant;

when the variable optical attenuator of the laser I has transitioned to a state of maximum attenuation and the variable optical attenuator of the laser II has transitioned to a state of low attenuation, the control module 175 removes power from the laser I; and the switch is complete.

If the determination at inquiry step 325 of process 300 is negative rather than positive, inquiry step 330 follows step 325. At inquiry step 330, the control module 175 determines whether the environmental temperature is outside the laser selection threshold two 230 of the running or active laser. The determination can proceed by subtracting the temperature of the running or active laser from the environmental temperature and then comparing the subtraction result to the laser selection threshold two 230. If the active or running laser's temperature is beyond the laser selection threshold two 230 of the environmental temperature, then step 335 follows step 330. As discussed above, the control module 175 and the laser selector 130 implement a laser switch at step 335.

As shown in the area of the graph 200 above the reference number 211, the laser selection threshold two 230 can be smaller than the temperature step selection threshold two 240. Accordingly, in the illustrated embodiment, the laser switch occurs in advance of the temperature change. In this graph area 211, the laser B 110 has the temperature 212 and is running or active as a result of an earlier selection. Environmental temperature decreases as shown by the plot 205. When the difference between environmental temperature and the temperature 212 exceeds the laser selection threshold two 230, the laser B 110 switches off, stops running, ceases or suspends modulation, becomes inactive, is deactivated, or otherwise changes states or modes. In its place, the laser A 105 switches on, starts running, initiates modulation, becomes active, is activated, or otherwise changes states or modes. (See the trace 250 immediately to the left of the lead line associated with the reference number 213.)

If execution of step 330 results in a negative determination, rather than a positive determination as discussed above, then process 300 loops back to step 310 and execution continues. Accordingly, process 300 can continue managing multiple lasers to track a fluctuating environmental temperature individually. Moreover, process 300 can continue alternating between (or among) multiple lasers to provide a consistent wavelength (or other light processing objective) across a range of temperatures that would otherwise impact the wavelength or objective.

As an alternative to steps 325, 330, and 335 as illustrated in the flowchart of FIG. 3 and discussed above, the control module 175 can implement another methodology for laser selection. For example, in certain exemplary embodiments, the laser having the temperature closest to the temperature of the operating environment may be selected for operating. In such an embodiment, if the operating environment's temperature comes within a threshold of the active laser's temperature, a laser switch can be implemented.

In certain other exemplary embodiments, the laser having the highest temperature will be selected for operation. In an embodiment, the laser switch can be delayed until any transients stemming from a temperature change have subsided.

In certain exemplary embodiments, the control module 175 sets the respective temperatures of multiple lasers to individual setpoints that are substantially fixed and that are spread across the expected swing or variation of the environmental temperature. For example, if an operating environment was expected to have a maximum temperature of 55° C. and a minimum temperature of 0° C. degrees, four lasers might have respective temperature setpoints 108, 109 of 15° C., 30° C., 45° C., and 60° C. Each setpoint temperature supports a substantially like wavelength 265 for its associated laser. For example, the temperatures 203, 212, and 206 (as shown in FIG. 2B) could coincide respectively with 15° C., 30° C., and 45° C. (Typically, but not necessarily, more than one step 220 would be between a 15° C. change in temperature.) In such an embodiment, the control module 175 runs the 15° C.-setpoint laser when environmental temperature is between 0° C. and 14° C., the 30° C.-setpoint laser when environmental temperature is between 14° C. and 29° C., the 45° C.-setpoint laser when environmental temperature is between 29° C. and 44° C., and the 60° C.-setpoint laser when environmental temperature is above 44° C. (None of the aforementioned temperature values are limiting.) For applications in which environment temperature is high infrequently, the laser having the highest temperature setpoint is runs only occasionally and thus avoids premature failure due to extended high-temperature operation. Likewise, the lasers that operate the most would be subjected to the most moderate temperatures and thus would also have longevity. In certain exemplary embodiments, each laser temperature can be controlled via heating alone. For example, when environmental temperature is below the setpoint, heat is added either via a heater 145 or via heat generated by the laser. When environmental temperature is above the setpoint (and the laser is not operating), the laser's temperature can float with the environmental temperature. Alternatively, each laser could be controlled to maintain its temperature whether the environmental temperature is higher or lower than the environment, for example via a TEC.

In certain exemplary embodiments, multiple lasers are deployed with each being optimized for operation in a specific temperature range. In such an embodiment, the control module 175 can run whichever laser it determines is best suited for current environmental conditions.

In certain exemplary embodiments, the control module 175 can comprise an automatic control circuit or program, which may be digital or analog or a hybrid between digital and analog. In one exemplary embodiment, the control module 175 comprises at least one proportional plus integral ("PI") controller. In one exemplary embodiment, the control module 175 comprises a proportional plus integral plus derivative ("PID") controller. In various other exemplary embodiments, the control module 175 can comprise a Kalman filter, a stochastic filter, a deadbeat controller, a multivariate controller, a least-squares computation, an anti-reset windup provision, a feed forward correction, a digital controller, an analog controller, fuzzy logic, cascaded control, microprocessor-based control, or some other effective feedback control loop or appropriate automatic feedback control means. Certain exemplary embodiments of the control module 175 can utilize one or more of the technologies discussed in this paragraph for causing the lasers 105 and 110 to track environmental temperature, for laser selection, for prediction, and/or for local temperature control (such as in the loop temperature controllers 155), for example.

Turning now to FIG. 5A, this figure illustrates a perspective view of an exemplary lasing system 540 packaged in a TO-can-style enclosure 590 according to certain embodiments of the present invention. The illustrated TO-can-style enclosure 590 provides one example of the case 150 illustrated in FIG. 1 and discussed above.

The illustrated TO-can-style enclosure 590, which can be viewed as an embodiment of a "TO can," houses the laser A 105 and the laser B 110. The lasers 105 and 110 are mounted to a member 555 functioning as a heat sink that receives and dissipates heat produced by the heaters 145 (see FIG. 1) and in connection with light generation. The member 555 comprises a channel 550, with the laser A 105 attached on one side of the channel 550, and the laser B 110 attached on the opposite side of the channel 550. The channel 550 provides thermal isolation for the lasers 105 and 110, so the respective laser temperatures can be individually regulated or controlled, as discussed above. In the illustrated embodiment, a gas, such as air or nitrogen, is disposed in the channel 550. Alternatively, the channel 550 can be filled with insulating material, such as a foamed ceramic, for example. In various exemplary embodiments, one or more slits, notches, slices, troughs, grooves, cuts, separations, insulations, channels, or other appropriate technology for impeding heat conduction or flow can facilitate thermal isolation of the lasers 105 and 110.

The lasers 105 and 110 face an exemplary embodiment of the signal combiner 115, which feeds each laser's output to a common waveguide segment. The signal combiner 115 straddles the channel 550 so as to be positioned to receive light from whichever laser 105, 110 is running. In the illustrated exemplary embodiment of FIG. 5A, the signal combiner 115 comprises a planar lightguide circuit, with a directional coupler that comprises a form of a Y-branch. The signal combiner's waveguide geometry can be viewed as bifurcated, forked, Y-branched, or split, with each laser 105, 110 feeding one of two legs and light exiting the planar lightguide circuit opposite the lasers 105, 110.

Each leg of the Y-branch has an associated optical attenuator 517, which may be a variable optical attenuator or a two-state optical attenuator, for example. In certain exemplary embodiments, the optical attenuators 517 attenuate the output of the unselected laser (laser 105 or 110) while allowing light from the selected laser (laser 105 or laser 110) to pass and thereby exit the planar lightguide circuit. In certain exemplary embodiments, the optical attenuators 517 coordinate transitions between running one of the laser 105 and 110 and running the other one of the lasers 105 and 110. For example, when the control module 175 makes a decision to switch lasers, the optical attenuator 517 associated with the running laser can gradually transition to a state of light attenuation while the optical attenuator 517 of the other laser can gradually transition to a state of light transmission. In certain exemplary embodiments, both lasers 105 and 110 are above lasing threshold during the transition. Accordingly, the optical attenuators 517 can coordinate the transition to avoid any signal disruptions on the optical network 120 and/or minimize bit errors. The control module 175 can manipulate the optical attenuators 517 to implement such coordination via electrical connections (not illustrated) to the optical attenuators 517. (See also the discussion above regarding step 335 of process 300.) In certain exemplary embodiments, both optical attenuators 517 will attenuate laser light until the laser switch is complete.

In certain exemplary embodiments, the optical attenuators 517 are thermally activated. In certain exemplary embodiment, the optical attenuators 517 are controlled via an electro-optic effect. In certain exemplary embodiments, the optical attenuators 517 are controlled via an acousto-optic effect. In certain exemplary embodiments, the optical attenuators 517 are controlled via a magnetic, optical, or electrical field or via current. In certain exemplary embodiments, each optical attenuator 517 comprises polymeric material adjacent the associated waveguide leg. A control stimulus can manipulate the refractive index of the polymeric material to cause a variable amount of light to leak out of the waveguide, for example transitioning from high transmission to high attenuation.

In certain exemplary embodiments, the signal combiner 115 further comprises a modulator (not illustrated) on the common waveguide segment that is above the "Y" bifurcation (i.e. the main waveguide branch). The modulator can comprise a Mach-Zehnder interferometer, a lithium niobate modulator, or an EAM, for example. Such a modulator can encode or imprint information on light emitted by whichever one of the lasers 105 and 110 is active or running at any particular time.

Detectors 530 mounted at the base 575 of the TO-can-style enclosure 590 respectively monitor light emitted from the rear facets of the lasers 105 and 110. In certain exemplary embodiments, the detectors 530 comprise or are rear facet monitors for controlling laser intensity. In this manner, the control system 125 can regulate each laser's light intensity, for example to compensate for laser aging or to adjust power according to attenuation over communication links of different lengths.

In the illustrated exemplary embodiment, the control system 125 is disposed on the flanged base 575, specifically at the floor or bottom of the base 575 below the cylindrical extension 552. As illustrated, the control system 125 can comprise one or more integrated circuits, chips, or multi-chip modules, for example.

The housing TO-can-style enclosure 590 comprises a lensed aperture 565 mounted in an end of a cylindrical extension 552 (illustrated in "see-through" view). The cylindrical extension 552 has a general shape of a can and is typically formed of metal or ceramic or, in some cases, appropriate plastic material. The lensed aperture 565 couples light emitting from the signal combiner 115 into an optical fiber (not illustrated in FIG. 5A) for transmission over the optical network 120.

The lensed aperture 565 can comprise an optical element, such as a lens. In certain exemplary embodiment, the lensed aperture 565 can comprise one or more diffractive elements, holographic lenses, concave lenses, convex lenses, cylindrical lenses, Fresnel lens, planar lightguide circuit features, prisms, circulators, isolators, lens arrays, ball lenses, micro-optic components, nano-optic elements, planar micro-lenses, plano-convex lenses, convex-convex lenses, ion-exchanged components, interconnects, crystals, lenslets, or other suitable active or passive components for manipulating light.

The lensed aperture 565 comprises an exemplary embodiment of a port through which light passes. The term "port," as used herein, generally refers to a place of entry or exit, a passageway, an inlet or an outlet, an entrance or an exit, an input or an output, a connection, a connection point, a passage, or a line through which signals (optical, electrical, etc.) or data transmit into and/or out of a device or a system.

The leads 510 transmit electrical signals into and out of the TO-can-style enclosure 590. In various exemplary embodiments, the leads 510 can number three, four, five, six, seven, etc. The leads 510 can carry data, electrical power, status information, and so forth.

The joints and/or seams of the TO-can-style enclosure 590 can be formed via laser welding, bonding, arc welding, solder, braze, silver-loaded epoxy, etc. In various exemplary embodiments, the joints and/or seams can be hermetic seals, non-hermetic seals, moisture resistant, moisture proof, impervious to gaseous permeation, permeable, gas permeable, compliant with an industry standard, etc. In certain exemplary embodiments, the TO-can-style enclosure 590 is substantially permeable to moisture, water vapor, water gas, contamination, or other material to a level that exceeds a hermetic rating.

In certain exemplary methods for evaluating hermiticity of a device (e.g. the lasing system 540), helium is introduced into the device under test, and the rate of helium leaking back out of the device is detected. Helium can be introduced into the device via either sealing the device with some percentage of helium inside or placing the fully assembled device in a chamber pressurized with helium (a "helium bomb"). Loaded with helium, the device is then placed in a test chamber. A vacuum pump evacuates the test chamber, typically at 3.0 E-03 Torr or lower pressure. A helium detector, coupled to the test chamber, monitors for helium leaking out of the device and into the test chamber. Leak rate of the device is proportional to the amount of helium that the helium detector detects. As will be appreciated by those of ordinary skill having benefit of this disclosure, the helium detector's measurements can readily be mathematically correlated to base leak rate according to the amount of helium introduced into the device, pressurization parameters, internal volume, time lags within the test, and the flow mechanism for helium effusion.

In certain exemplary embodiments, the lasing system 540 exhibits a leak rate of at least 1.0 E-10 atm-cc/sec. In certain exemplary embodiments, the lasing system 540 exhibits a leak rate of at least 1.0 E-9 atm-cc/sec. In certain exemplary embodiments, the lasing system 540 exhibits a leak rate of at least 1.0 E-8 atm-cc/sec. In certain exemplary embodiments, the lasing system 540 exhibits a leak rate of at least 1.0 E-7 atm-cc/sec. In certain exemplary embodiments, the lasing system 540 exhibits a leak rate of at least 1.0 E-6 atm-cc/sec. In certain exemplary embodiments, the lasing system 540 exhibits a leak rate of at least 1.0 E-5 atm-cc/sec. In certain exemplary embodiments, the lasing system 540 exhibits a leak rate of at least 1.0 E-4 atm-cc/sec. In certain exemplary embodiments, the lasing system 540 exhibits a leak rate of at least 1.0 E-3 atm-cc/sec. In certain exemplary embodiments, the lasing system 540 exhibits a leak rate of at least 1.0 E-2 atm-cc/sec. In certain exemplary embodiments, the lasing system 540 exhibits a leak rate within a range between any two of the leak rates provided in this paragraph. As discussed above, providing high performance and wavelength control and wavelength stability in a package having relaxed sealing specifications can help lower manufacturing cost, device size, and device complexity; thereby opening new applications for optical communications and photonics in general.

Turning now to FIG. 5B, this figure illustrates an overhead view of an exemplary butterfly package 580 enclosing a lasing system according to certain embodiments of the present invention. In an exemplary embodiment, the butterfly package 580 encloses the control system 125, the laser A 105, the laser B 110, and the heaters 145 illustrated in FIG. 1 and discussed above. Also, the butterfly package 580 can further house monitor detectors 530, such as photodiodes as illustrated in FIG. 5A, and appropriate technology for separating the thermal paths of the lasers 105 and 110, such as the channel 550 discussed above. The optical fiber 585 carries light from whichever one of laser A 105 and laser B 110 is active or running. Thus the optical fiber 585 can lead to the optical network 120. Accordingly, the butterfly package 580 illustrated in FIG. 5B can provide an exemplary embodiment of the case 150 that FIG. 1 illustrates.

In various exemplary embodiments, the case 150 or the transmitter 100 (see FIG. 1) can have a geometric form of a butterfly-type package, a dual inline pin ("DIP") package, a dual inline ("DIL") packages, a "mini DIL" package, a "XENPAK" package, an "XPAK" package, an "X2" package, a "small form-factor pluggable" ("SFP") package, an "XFP" package, a TO-can, a TO-56 header package, an industry-standard package, a MCM package, a package conforming to a multi-source agreement ("MSA"), or some other appropriate package style or form factor.

Turning now to FIG. 6, this figure illustrates a perspective view of an exemplary laser die 600 comprising a heating element 145A according to certain embodiments of the present invention. The heating element 145A can be an exemplary embodiment of the heater 145 illustrated in FIG. 1 and discussed above. Further, the heater 145 can comprise the heating element 145A or vice versa.

In certain exemplary embodiments, the heating element 145A comprises metal or other appropriate material printed or otherwise attached to the laser die 600 in a photolithographically defined pattern. For example, the heating element 145A can comprise nichrome, silver ink, a sputtered film of Ta$_2$N, a patterned layer of vapor deposited Cr film, or other metal or material having suitable electrical resistance. Alternatively, the heating element 145A can comprise a pair of wires bonded or otherwise disposed on the laser die 600. Transmitting current through the heating element 145A generates heat for controlling the temperature of the laser die 600. Each end of the heating element 145A comprises pads for coupling electricity to the heating element 145A, for example via one or more wire or ribbon bonds. In the illustrated embodiment, the heating element 145A comprises two circuits (various embodiments may have fewer or more).

The laser die 600 comprises a ridge waveguide structure 625 for guiding light between opposing laser facets. In an exemplary embodiment, each of the laser A 105 and the laser B 110 can comprise an instance of the illustrated laser die 600.

Turning now to FIG. 7, this figure illustrates a perspective view of an exemplary laser die 700 comprising a heating element 145B according to certain embodiments of the present invention. In the illustrated exemplary embodiment, the heating element 145B is disposed on the side of the laser die 700. As discussed above with respect to FIG. 6, the heating element 145 can comprise a photolithographically patterned film or an attached wire, for example. In the exemplary embodiment of FIG. 7, the laser die 700 comprises a waveguide 725 that spans between opposite ends of the laser die 700. In certain exemplary embodiments, the laser A 105 and the laser B 110 can each comprise a laser die 700 in accordance with the illustration of FIG. 7.

Turning now to FIG. 8, this figure illustrates a perspective view of an exemplary lasing system 800 comprising three packaged lasers 825A, 825B, 825C according to certain embodiments of the present invention. The lasing system 800 further comprises a base 850 to which the lasers 825A, 825B, and 825C are mounted. In an exemplary embodiment, the base 850 is a member comprising channels 550 for creating distinct thermal paths leading from each of the lasers 825A, 825B, and 825C to a heat exit (not illustrated) that may comprise a heat spreader, dissipater, or manifold, for example. Accordingly, the channels 550 help thermally isolate the lasers 825A, 825B, and 825C from one another.

Each of the lasers 825A, 825B, and 825C is packaged in a TO can package that mates with a respective adapter 830 for coupling emitted light to a respective fiber optic cable 870. The three fiber optic cables 870 lead to the signal combiner 115. In certain exemplary embodiments, the signal combiner 115 comprises a fused coupler that couples light from whichever one of the lasers 825A, 825B, and 825C is active, running, or otherwise selected to the fiber optic cable 830.

In accordance with certain exemplary embodiments of the present invention, each of the lasers 825A, 825B, and 825C tracks fluctuating environmental temperature following a distinct temperature course. The laser tracking can proceed in accordance with the graph 200 of FIG. 2A and the foregoing discussion, for example. In certain exemplary embodiments, the control module 185 sets each laser 825A, 825B, and 825C to a different temperature step 220, for example. Alternatively, the lasers 825A and 825B track environment temperature as illustrated in the graph 200, while the laser 825C is held in reserve. In this alternative, the control module 175 can activate the back-up laser 825C if required.

Figure 9A:
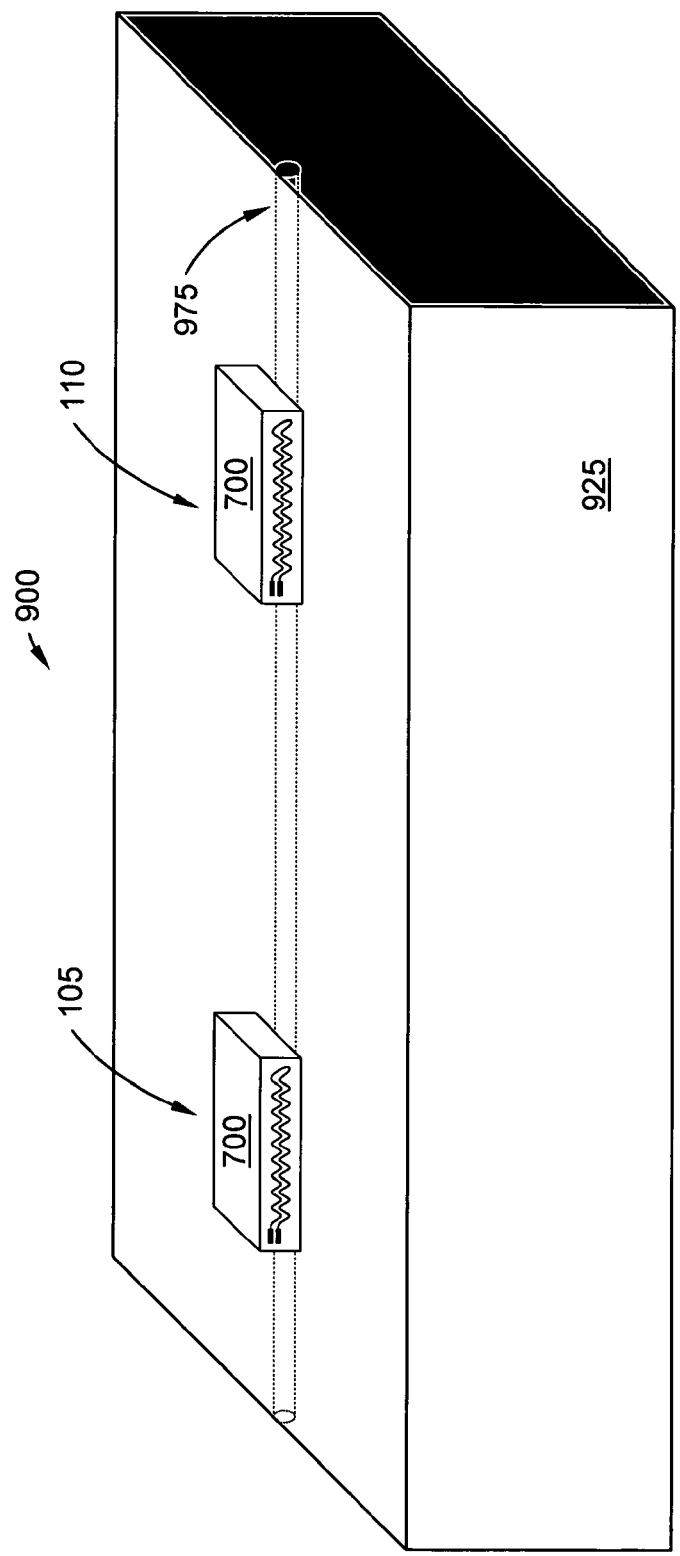
FIG. 9A is a perspective illustration of a lasing system comprising two laser dies coupled to an optical waveguide in accordance with certain exemplary embodiments of the present invention.
Figure 9B:
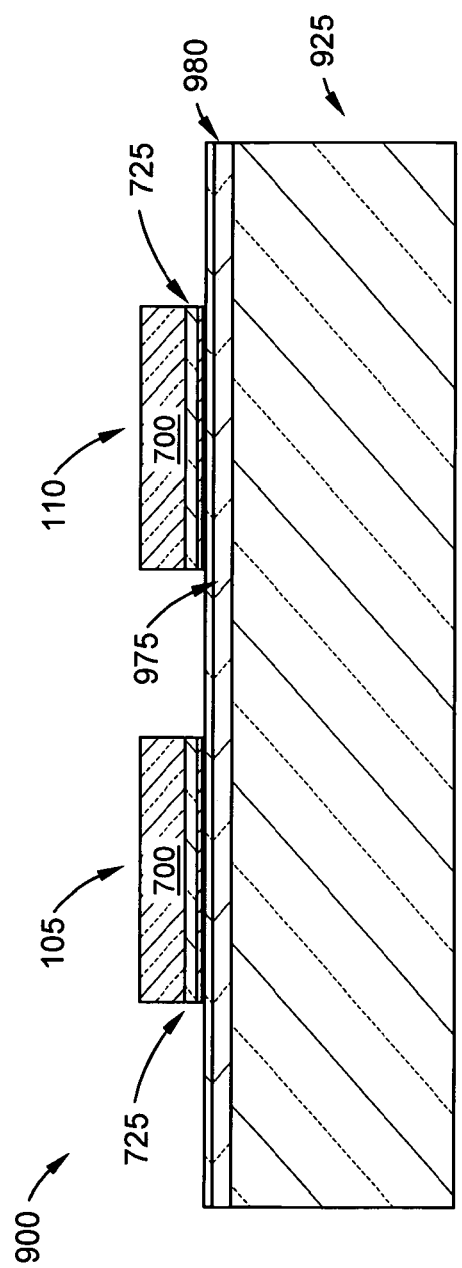
FIG. 9B is a cross sectional illustration of a lasing system comprising two laser dies coupled to an optical waveguide in accordance with certain exemplary embodiments of the present invention.

Turning now to FIGS. 9A and 9B (collectively FIG. 9), FIG. 9A illustrates a perspective view of an exemplary lasing system 900 comprising two laser dies 700 coupled to an optical waveguide 975 according to certain embodiments of the present invention. FIG. 9B illustrates a cross sectional view of the exemplary lasing system 900 comprising the two laser dies 700 coupled to the optical waveguide 975 according to certain embodiments of the present invention.

The planar lightguide circuit 925 comprises the optical waveguide 975. In certain exemplary embodiments, the planar lightguide circuit 925 comprises silicon. For example, the waveguide 975 can comprise silicon dioxide on a silicon substrate. In certain exemplary embodiment, the waveguide 975 comprises silicon that may be doped to achieve an optical effect.

In the exemplary embodiment that FIG. 9 illustrates, the laser A 105 and the laser B 110 each comprises one of the laser dies 700. Each laser die 700 is bonded to the planar lightguide circuit 925 so that the optical waveguide 725 of the laser die 700 is adjacent to and runs alongside the optical waveguide 975. The bonding can comprise so called "glass bonding" technology, for example, which is a known technique that can be implemented readily and without undue experimentation by one of ordinary skill having benefit of this disclosure. For example, the laser dies 700 can be bonded to an integrated waveguide member utilizing appropriate techniques as described in U.S. Patent Application Publication Number 2008/0002929 to John Bowers et al.

In this configuration, the light emitting from whichever laser die 700 is activated, running, or otherwise selected couples into the waveguide 975 for transmission to the optical network 120 that FIG. 1 illustrates. Light from the laser 105 or light from the laser 110 can couple across a bonding interface from an active semiconductor material, for example a III-V semiconductor bar that comprises InP, AlGaInAs, and/or InP/InGaAsP, to an optical waveguide (e.g. the optical waveguide 975) comprising SiO$_2$ and/or some appropriate material. The optical waveguide 975, which can be passive or active for example, thereby transmits light from a selected one of the lasers 105 and 110.

Accordingly, the planar light guide circuit 925 effectively performs the function of the signal combiner 115 so that light from each of the lasers 105 and 110 flows onto a common waveguide—in this example the optical waveguide 975. Light exits the optical waveguide 975 through the port 980, for transmission over the optical network 120 or some other appropriate transmission medium.

Figure 10:
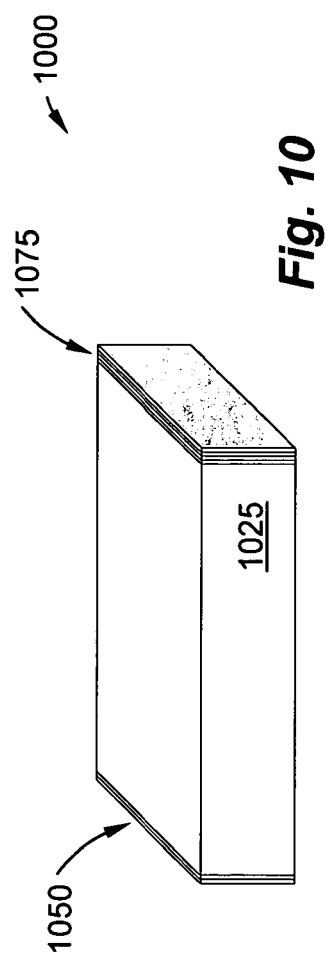
FIG. 10 is a perspective illustration of a edge emitting laser die comprising facets that are each coated with a respective system of temperature insensitive optical thin films for mode management in accordance with certain exemplary embodiments of the present invention.

Turning now to FIG. 10, this figure illustrates a perspective view of an exemplary edge emitting laser die 1025 comprising facets that are each coated with a respective system of temperature insensitive optical thin films for mode management according to certain embodiments of the present invention. In certain exemplary embodiments, the laser A 105 and the laser B 110 each comprises one of the laser dies 1025. Further, the laser die 1025 can be or can comprise the laser die 600 or the laser die 700 discussed above. Thus, either of the laser dies 600 and 700 can comprise the features illustrated in FIG. 10 in addition to the features discussed above.

In the coated laser die 1000, the rear facet coating 1050 provides broadband reflectivity, for example reflecting about 90 to 95 percent of incident light and transmitting the remaining 5 to 10 percent of incident light. As illustrated in FIG. 5A and discussed above, the detector 530 can receive some of the transmitted light for monitoring purposes. In certain exemplary embodiments, the rear facet coating 1050 comprises multiple high index refractive layers interleaved between multiple low index of refractive layers. The rear facet coating 1050 can comprise alternating refractive index thin film layers that provide reflection and transmission via thin-film interference.

The front facet coating 1075 provides wavelength selective reflectivity and transmission, for example reflecting about 70 to 85 percent of incident light in a defined spectral region while providing high transmission outside that defined spectral region. The spectral regions of high transmission can provide about 96 to 99.9 percent transmission substantially across the spectral gain region of the laser die 1025, for example. In certain exemplary embodiments, the front facet coating can be characterized as a notch reflector, in that it provides reflectivity in a spectral notch. In certain exemplary embodiments, the front facet coating 1075 comprises multiple high index of refractive layers interleaved between multiple low index of refractive layers. The front facet coating 1075 can comprise alternating refractive index thin film layers that provide reflection and transmission via thin-film interference.

In certain exemplary embodiments, the thin film layers of the front facet coating 1075 and the rear facet coating 1050 comprise silicon dioxide and tantalum pentaoxide. That is, the high index layers comprise tantalum pentaoxide (e.g. $Ta_2O_5$), and the low index layers comprise silicon dioxide ($SiO_2$). With this material system, the spectral characteristics of the front facet coating 1075 and the rear facet coating 1050 remain substantially uniform across the operating temperature range of the transmitter 100, the case 105, the lasers 105 and 110, and/or the environment. Accordingly, the front facet coating 1075 and the rear facet coating 1050 can provide mirrors with spectral properties that are substantially temperature invariant (across a specified operating temperature), for example. As will be discussed in further detail below with reference to FIG. 12, such mirrors can form a lasing cavity in a manner that is substantially invariant to temperature fluctuations.

Figure 11:
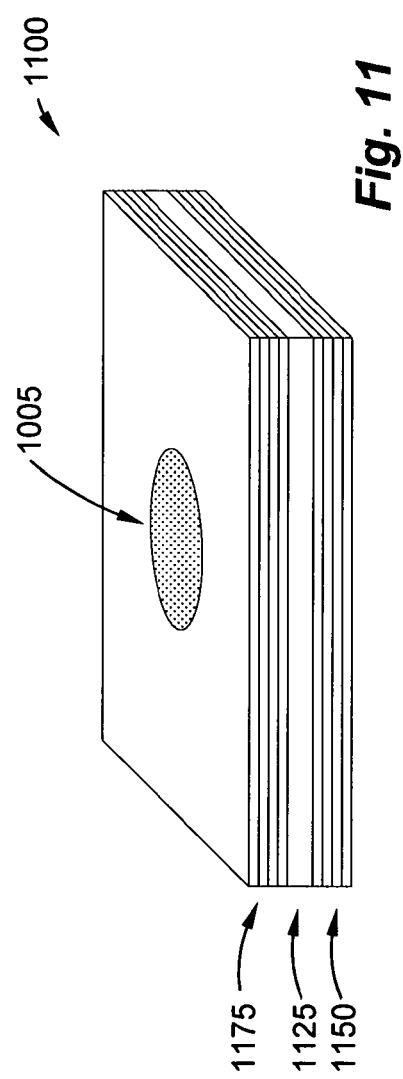
FIG. 11 is a perspective illustration of a vertical cavity surface emitting laser ("VCSEL") die coated with a system of temperature insensitive optical thin films for mode management in accordance with certain exemplary embodiments of the present invention.

Turning now to FIG. 11, this figure illustrates a perspective view of an exemplary VCSEL die 1100 coated with a system of temperature insensitive optical thin films for mode management according to certain embodiments of the present invention. The gain medium 1125 of the VCSEL 1100 is sandwiched between a stack 1175 of thin films of alternating refractive index materials adjacent the exit port 1005 of the VCSEL 110 and another stack 1150 of thin films of alternating refractive index materials. To promote temperature insensitivity of the stacks 1175 and 1150, the alternating refractive index materials can be silicon dioxide and tantalum pentaoxide as discussed above with reference to FIG. 10. Accordingly, temperature insensitive mirrors can form the laser cavity of the VCSEL 1005.

In certain exemplary embodiments, the laser A 105 and the laser B 110 each comprises one of the VCSEL dies 1100 as illustrated in FIG. 11. In certain exemplary embodiments of the present invention, the gain medium 1125 is thick enough to support multiple modes within the gain profile of the gain medium 1125, but the spectral characteristics of the stacks 1150 and 1175 limit the number of modes that lase. The free spectral range of the gain medium 1125 spans less wavelength than the spectral region of reflectivity (e.g. the notches) provided by the stacks 1150 and 1175. Accordingly, the VCSEL die 1100 can provide single longitudinal mode lasing with a thicker gain medium 1125 than may otherwise be feasible with typical conventional technologies. A thicker gain medium 1125 can support higher output powers of light and/or faster direct modulation, for example.

Figure 12A:
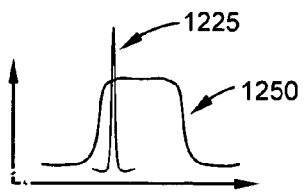
FIGS. 12A, 12B, 12C, 12D, 12E, 12F, 12G, and 12H (collectively FIG. 12) are plots of a spectral profile of a temperature insensitive facet coating overlaid with output wavelength for a laser, with each plot representative of a different temperature, in accordance with certain exemplary embodiments of the present invention.
Figure 12B:
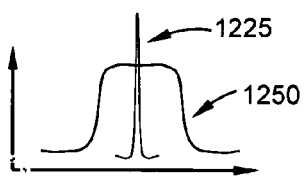
Figure 12C:
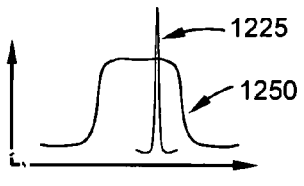
Figure 12D:
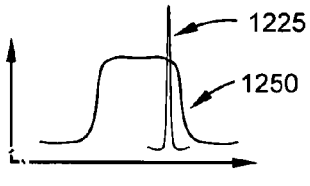
Figure 12E:
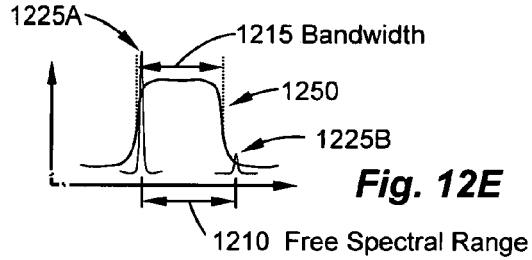
Figure 12F:
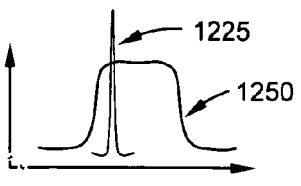
Figure 12G:
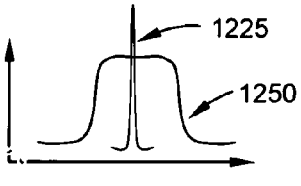
Figure 12H:
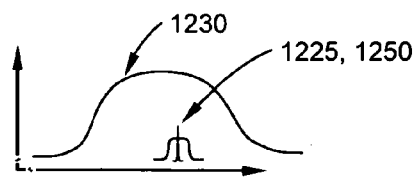

Turning now to FIGS. 12A, 12B, 12C, 12D, 12E, 12F, 12G, and 12H these figures illustrate plots 1250, 1225 of a spectral profile of a temperature insensitive facet coating overlaid with output wavelength for an exemplary laser, with each plot representative of a different temperature, according to certain embodiments of the present invention. FIG. 12H further illustrates an overlaid plot 1230 of an exemplary gain profile plot.

In accordance with certain exemplary embodiments, the plot 1250 can represent spectral characteristics of the front facet coating 1075 of the coated laser die 1000 illustrated in FIG. 10 and discussed above, and will be discussed as such. More specifically, the plot 1250 represents coating reflectivity (Y-axis) as a function of wavelength (X-axis). Higher values indicate higher reflectivity, while lower values reflect higher transmission.

In accordance with certain exemplary embodiments, the plot 1225 can represent spectral characteristics of light emitted from the coated laser die 1000 illustrated in FIG. 10 and discussed above, and will be discussed as such. The plot 1225 represents intensity as a function of wavelength such that higher value indicates higher intensity or optical power.

The plot 1225 and the plot 1250 are overlaid upon one another with common wavelength. That is, the plots 1225 and 1250 have the same X-axis and thus like wavelength scales. With the amplitude of the plot 1225 representing optical power and the amplitude of the plot 1250 representing reflectivity, the Y-axes scales are different.

FIGS. 12A, 12B, 12C, 12D, 12E, 12F, and 12G illustrate a progressive change in temperature for the coated laser die 1000. Those figures illustrate an example of how the coated laser die 1000 can respond to temperature change. In certain cases, FIGS. 12A-12H and FIG. 2B describe like embodiments, or the same embodiment. In certain exemplary embodiments, FIG. 2B is a companion to FIGS. 12A-12 H. Accordingly, FIGS. 12A-12H can provide additional information relevant to the plot 255 illustrated in FIG. 2B and discussed above. Similarly, the plot 255 of FIG. 2B and the accompanying discussion can provide additional information relevant to FIGS. 12A-12H.

FIG. 12A illustrates exemplary reflectivity of the front facet coating 1075 and lasing wavelength with the coated laser die 1000 operating at a first temperature. FIG. 12B illustrates exemplary reflectivity of the front facet coating 1075 and lasing wavelength with the coated laser die 1000 operating at a second temperature, shifted from the first temperature in a direction. FIG. 12C illustrates exemplary reflectivity of the front facet coating 1075 and lasing wavelength with the coated laser die 1000 operating at a third temperature, shifted from the second temperature in the same direction. FIG. 12D illustrates exemplary reflectivity of the front facet coating 1075 and lasing wavelength with the coated laser die 1000 operating at a fourth temperature, shifted from the third temperature in the same direction. FIG. 12E illustrates exemplary reflectivity of the front facet coating 1075 and lasing wavelength with the coated laser die 1000 operating at a fifth temperature, shifted from the fourth temperature in the same direction. FIG. 12F illustrates exemplary reflectivity of the front facet coating 1075 and lasing wavelength with the coated laser die 1000 operating at a sixth temperature, shifted from the fifth temperature in the same direction. FIG. 12G illustrates exemplary reflectivity of the front facet coating 1075 and lasing wavelength with the coated laser die 1000 operating at a seventh temperature, shifted from the sixth temperature in the same direction.

As temperature changes, the longitudinal mode of the coated laser die 1000, as represented by the plots 1225, progressively shifts to higher wavelength across the reflective band of the front facet coating 1075 that the plots 1250 represent. Meanwhile, the reflective band of the front facet coating 1075 remains substantially uniform or temperature invariant. Typically, but not necessarily, the rear facet coating 1050 may be reflective across a broader range of wavelengths than the front facet coating 1075, with the rear facet coating 1050 likewise being substantially temperature invariant. (In certain exemplary embodiments, the reflective characteristics of the front and rear facet coatings 1050, 1075 can be reversed so that the rear facet coating 1050 has a narrower bandwidth than the front facet coating 1075.)

The length of the laser die 1025 disposed between the front facet coating 1075 and the rear facet coating 1050 grows with increasing temperature and shrinks with decreasing temperature via thermal expansion and contraction. Such thermal expansion and contraction results in wavelength shifting.

The series of FIGS. 12D, 12E, and 12F illustrates a mode hop event, whereby the longitudinal mode abruptly changes. See also the abrupt changes 270 that FIG. 2B illustrates as discussed above. As illustrated in FIG. 2E, the luminous energy output by the coated laser die 1000 transfers from the longitudinal mode 1225B to the longitudinal mode 1224A as the longitudinal mode 1225B shifts outside the band of reflectivity and the longitudinal mode 1225A shifts into the band of reflectivity. Thus, the longitudinal mode 1225A becomes energized in the longitudinal mode 1225B becomes de-energized. As will be appreciated by those of ordinary skill having benefit of this disclosure, the longitudinal modes 1225A and 1225B are separated by the free spectral range 1210 of the coated laser die 1025. Meanwhile, the front facet coating 1075 provides a bandwidth 1215 of reflectivity. The term bandwidth 1215, as used herein in this context, generally refers to a full width half-maximum ("FWHM") parameter as will be appreciated by those of ordinary skill having benefit of this disclosure.

In accordance with certain exemplary embodiments, the free spectral range 1210 is less than the bandwidth 1215 of the band of reflectivity of the front facet coating 1075. In accordance with certain exemplary embodiments, the free spectral range 1210 is slightly less than the bandwidth 1215 of the band of reflectivity of the front facet coating 1075. In accordance with certain exemplary embodiments, the free spectral range 1210 is approximately or substantially equal to the bandwidth 1215 of the band of reflectivity of the front facet coating 1075. In accordance with certain exemplary embodiments, the free spectral range 1210 is slightly greater than the bandwidth 1215 of the band of reflectivity of the front facet coating 1075. In accordance with certain exemplary embodiments, the free spectral range 1210 is larger than the bandwidth 1215 of the band of reflectivity of the front facet coating 1075. In accordance with certain exemplary embodiments, the free spectral range 1210 is substantially larger than the bandwidth 1215 of the band of reflectivity of the front facet coating 1075.

In accordance with certain exemplary embodiments, the free spectral range 1210 is about 0.05 percent larger than the bandwidth 1215 of the band of reflectivity of the front facet coating 1075. In accordance with certain exemplary embodiments, the free spectral range 1210 is about 1 percent larger than the bandwidth 1215 of the band of reflectivity of the front facet coating 1075. In accordance with certain exemplary embodiments, the free spectral range 1210 is about 2 percent larger than the bandwidth 1215 of the band of reflectivity of the front facet coating 1075. In accordance with certain exemplary embodiments, the free spectral range 1210 is about 3 percent larger than the bandwidth 1215 of the band of reflectivity of the front facet coating 1075. In accordance with certain exemplary embodiments, the free spectral range 1210 is about 5 percent larger than the bandwidth 1215 of the band of reflectivity of the front facet coating 1075. In accordance with certain exemplary embodiments, the free spectral range 1210 is about 7 percent larger than the bandwidth 1215 of the band of reflectivity of the front facet coating 1075. In accordance with certain exemplary embodiments, the free spectral range 1210 is about 10 percent larger than the bandwidth 1215 of the band of reflectivity of the front facet coating 1075. In accordance with certain exemplary embodiments, the free spectral range 1210 is about 15 percent larger than the bandwidth 1215 of the band of reflectivity of the front facet coating 1075. In accordance with certain exemplary embodiments, the free spectral range 1210 is about 20 percent larger than the bandwidth 1215 of the band of reflectivity of the front facet coating 1075. In accordance with certain exemplary embodiments, the free spectral range 1210 is about 25 percent larger than the bandwidth 1215 of the band of reflectivity of the front facet coating 1075. In accordance with certain exemplary embodiments, the free spectral range 1210 is about 40 percent larger than the bandwidth 1215 of the band of reflectivity of the front facet coating 1075. In accordance with certain exemplary embodiments, the free spectral range 1210 is about 50 percent larger than the bandwidth 1215 of the band of reflectivity of the front facet coating 1075. In accordance with certain exemplary embodiments, the free spectral range 1210 is about 100 percent larger than the bandwidth 1215 of the band of reflectivity of the front facet coating 1075. In accordance with certain exemplary embodiments, the free spectral range 1210 is about 200 percent larger than the bandwidth 1215 of the band of reflectivity of the front facet coating 1075. In accordance with certain exemplary embodiments, the free spectral range 1210 is within a range of any two of the values disclosed in this paragraph in relation to the bandwidth 1215 of the band of reflectivity of the front facet coating 1075.

FIG. 12H illustrates an exemplary plot 1230 of gain profile overlaid upon the plots 1225 and 1250 that FIG. 12G illustrates. The plot 1230 represents light amplification or gain as a function of wavelength. Accordingly, each of the plots 1225, 1250, and 1230 are presented on a common wavelength scale (X-axis) and have different measurement units and different scales (Y-axis).

In certain exemplary embodiments, gain characteristics of the coated laser die 1000 can shift or change with temperature. In certain exemplary embodiments, the gain of the laser die 1025 decreases as temperature increases. As discussed above, in certain exemplary embodiments, the transmitter 100 can comprise lasers having gain profiles that are suited to various operating conditions or temperatures. The control module 175 can select a specific laser with a specific gain profile that is matched to temperature. In other words, the control module 175 can implement a laser selection based on matching gain profiles to measured operating conditions, such as temperature.

Figure 13:
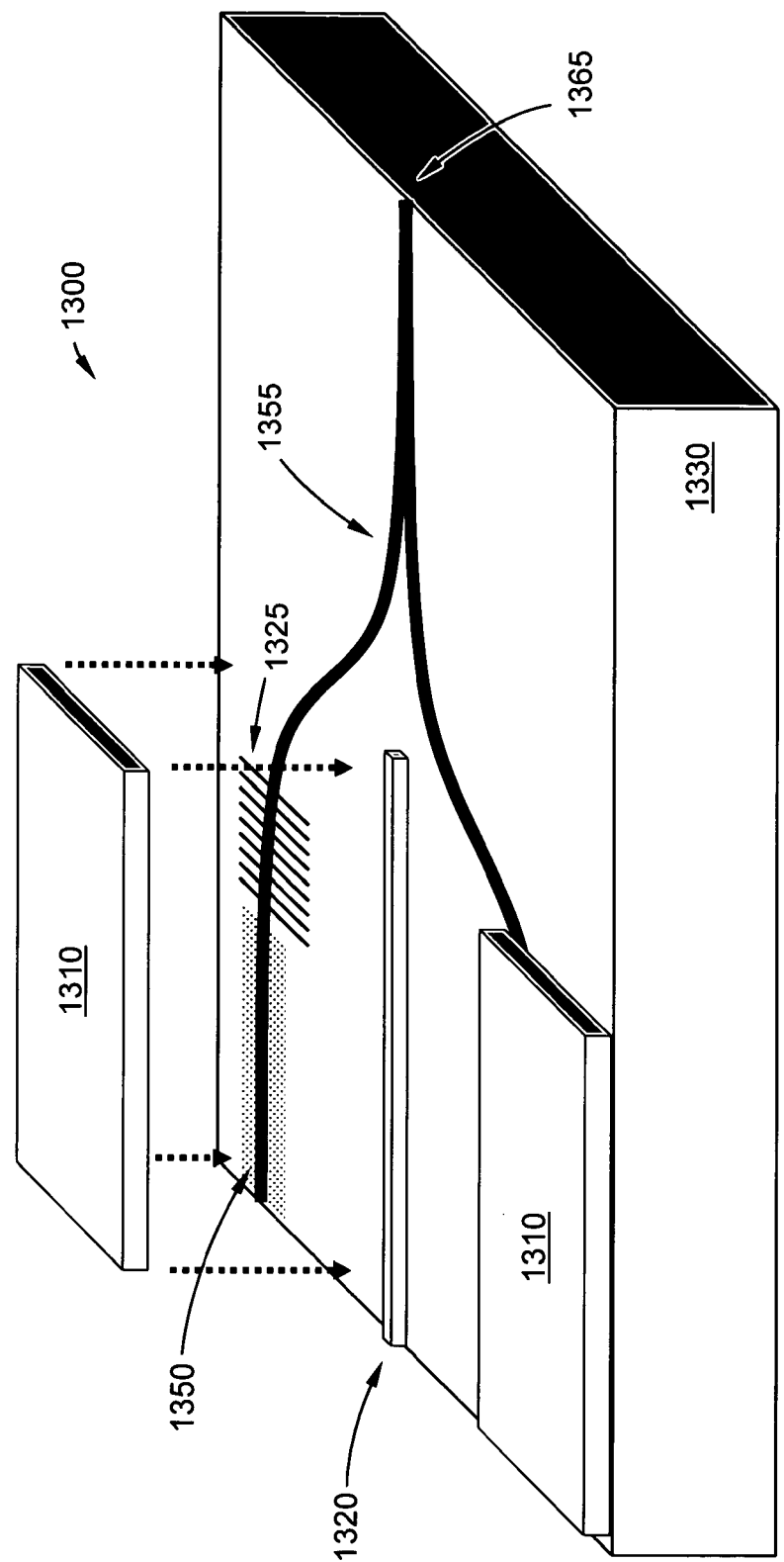
FIG. 13 is a perspective illustration of a lasing system comprising two lasers integrated in a monolithic structure in accordance with certain exemplary embodiments of the present invention.

Turning now to FIG. 13, this figure illustrates a perspective view of an exemplary lasing system 1300 comprising two lasers 1350 integrated in a monolithic structure according to certain embodiments of the present invention.

Active temperature controllers 1310, such as TECs, are attached to the substrate 1330, for example via bonding, adhesive, fasteners, or spring loading. As illustrated, one of the temperature controllers 1310 is lifted to illustrate exemplary underlying structures of the substrate 1330. The lasing system 1300 can be mounted upside down (with respect to the illustrated orientation) against a heat sink or other thermal pathway, so that the TECs can transfer heat away from the lasing system 1300. A groove in the substrate 1330 filled with an insulating material, such as a foamed ceramic, thermally isolates the lasers 1350 with respect to one another.

In certain exemplary embodiments, the active temperature controllers 1310 remove heat from the lasers 1350 so that the lasers 1350 operate below environmental temperature. In certain exemplary embodiments, the active temperature controllers 1310 apply heat to the lasers 1350 so that the lasers 1350 operate above environmental temperature. In certain exemplary embodiments, the active temperature controllers 1310 remove heat from the lasers 1350 at some times and at other times apply heat to the lasers 1350, so that the lasers 1350 may operate sometimes below and sometimes above the environmental temperature. The control module 175 can set the individual temperatures of the laser 1350 as described above.

Beneath each temperature controller 130, a corrugation 1325 or series of substantially parallel grooves functions as a grating. The corrugation 1325 in combination with the adjacent face of the substrate 1330 forms a lasing cavity.

The Y-branch structure 1355 leads light from whichever laser 1350 has been activated to the output port 1365. Accordingly, the illustrated Y-branch structure 1355 can comprise an exemplary embodiment of the signal combiner 115 illustrated in FIG. 1 and discussed above.

As discussed above, certain exemplary embodiments of the present invention can comprise redundant lasers or a backup laser to address accelerated aging or premature failure due to operating a laser at an elevated temperature. Such embodiments will be described in further detail with reference to FIGS. 14 and 15.

Turning now to FIG. 14, this figure illustrates a perspective view of a lasing system 1400 comprising three redundant lasers 1410, 1420, and 1430 formed as a monolithic structure 1330 in accordance with certain exemplary embodiments of the present invention. The lasing system 1400 can comprise a planar lightguide circuit, a planar lightwave circuit, a "PLC," a photonic integrated circuit, and/or a "PIC."

In certain exemplary embodiments, the transmitter 100 illustrated in FIG. 1 comprises two of the lasing systems 1400, one functioning as the laser A 105 and its associated heater 145, and one functioning as the laser B 110 and its heater 145. Alternatively, the lasing system 1400 can operate as a standalone device, be included as an element of a conventional transmitter system, or be housed in a butterfly or TO-can package (or some other enclosure) for mounting on a conventional transmitter board, for example. Accordingly, the lasing system 1400 can be either applied to one of the aforementioned embodiments that are discussed above with reference to FIGS. 1-13 or deployed in some other appropriate system, device, or application.

Each of the lasers 1410, 1420, and 1430 comprises a gain region 1405 disposed within a lasing cavity formed by a corrugation 1325 and a surface on the opposite side of the gain region 1405. Alternatively, the lasing cavity can be disposed between two such corrugations. As discussed above, the Y-branch structure 1355 directs light from whichever one of the lasers 1410, 1420, 1430, and 1440 is active to the output port 1365. A thermal unit 1450, which typically emits heat into the substrate 1330 but may alternatively extract heat from the substrate 1330, regulates the lasers 1410, 1420, 1430 to a desired temperature. In certain exemplary embodiments, the desired temperature may track a fluctuating environmental temperature as discussed above.

In certain exemplary embodiments, the desired temperature may be set at or above the highest expected temperature of an operating environment. Thus, the lasers 1410, 1420, 1430 can operate at a temperature setpoint that supports emitting light in a DWDM channel 275 (see FIG. 2B for example) or otherwise complying with a DWDM specification. As discussed above, lasing wavelength can be held uniform via maintaining a uniform temperature. To address shortened lifetime associated with high-temperature operations, the lasing system 1400 can switch lasers in advance of failure. As will be discussed in further detail below, the control system 125 can estimate lifetime remaining for a currently operating one of the lasers 1410, 1420, 1430 based on recording and/or tracking operating times and temperatures. When a threshold level of laser life is consumed, the control system 125 can switch to another one of the lasers 1420, 1420, and 1430 via sending signals over the traces 1440. In certain exemplary embodiments, the switch occurs in advance of laser failure. In certain exemplary embodiments, the switch occurs upon detection of a failure condition, a failure precursor, a failure predictor, a condition that precedes full failure, or a change in performance indicating that a failure is imminent or probable. Alternately, the control module 125 can switch among the lasers 1410, 1420, and 1430 in round-robin style so that each laser 1410, 1420, 1430 ages at substantially the same pace.

Accordingly, exemplary embodiments of the lasing system 1400 can comprise at least one laser that can be a duplicate laser, a reserve laser, a backup laser, a secondary laser, a standby laser, an alternate laser, an extra laser, a spare laser, a substitute laser, a redundant laser, a replacement laser, or a supplementary laser, for example, and such a laser can mitigate shortened lifetime associated with high-temperature operation.

The control system 125 controls the thermal unit 1450 over the ribbon bonds 1475. Feedback can come from a discrete wavelength locker system 1485 that taps the output light 1490. Exemplary embodiments of such a discrete wavelength locker system 1485 can comprise conventional devices available from commercial sources such as JDS Uniphase Corporation of Milpitas, Calif.

Alternatively, the lasing system 1400 can comprise a tap 1455 attached to, grown on, or integrated in the substrate 1330. The tap 1445 diverts light to a detection feature 1470 via an integrated waveguide 1465. The detection feature 1470 provides corresponding electrical signals to the control system 125. The control system 125 then adjusts the thermal unit 1450 to maintain a substantially constant lasing temperature and/or a substantially uniform lasing wavelength.

Turning now to FIG. 15, this figure illustrate a flowchart of an exemplary process 1500 for operating lasers 1420, 1420, and 1430 at elevated temperatures and switching lasers 1420, 1420, and 1430 in advance of laser failure according to certain embodiments of the present invention. Process 1500, which is entitled "Mitigate Premature Failure Due to Elevated Temperature Operations," will be discussed with exemplary reference to FIG. 14 and certain other figures as described above. As discussed below, switching lasers in response to an occurrence of a failure precursor event or to a failure predictor meeting a criterion can mitigate temperature induced failure.

At step 1505 of process 1500, units or instances of the lasing system 1400 undergo accelerated aging testing. Such tests are typically, but not necessarily, conducted after an initial burn-in intended to eliminate any infant mortalities from subsequent testing. Since determining lifetime of optoelectronic devices under actual operating conditions would typically involve conducting tests over impractically long periods of time, accelerated lifetime testing is a common practice for estimating lifetime. Accelerated lifetime testing involves applying various stresses that physically and/or chronologically accelerate potential failures. The applied stresses, which can include excessive temperatures, supply voltages, electrical currents, and/or optical power output, determine wear-out periods and parameters via forcing device degradation. As will be discussed below with reference to step 1510, the test data can provide a statistical basis for device lifetimes and failure rates.

For example, a manufacturing line might fabricate 100 units of the lasing system 1400 and then operate groups of those 100 units at different elevated temperatures to induce premature failure. If the lasing system 1400 was to be deployed ultimately in an application involving operating at 60° C., groups of the units under test might be run at temperatures elevated significantly above 60° C., for example. Such temperatures could be 100° C., 125° C., 150° C., 175° C., and/or 200° C., for example, to cause premature failure over a period of weeks or months as compared to failure over years or decades of field deployment. Performance of each group tested is monitored or tested for failure or degraded function. In certain exemplary embodiments, groups of the units under test are subjected to different operating currents and/or power parameters. Thus, beyond elevated temperature, the accelerated aging tests can include collecting data describing relationship(s) between or among electrical input, optical output, and accelerated aging as manifested in an appropriate failure mode or indicator of performance degradation.

In certain exemplary embodiments, failures can include degradation where a parameter relevant to performance changes to such an extent that the lasing system 1400 does not function properly or deviates unacceptably from a network specificaiton. In certain exemplary embodiments, failures can include catastrophic failures in which the lasing system 1400 under test is destroyed or ceases to operate. In certain exemplary embodiments, voltage is held constant while monitoring changes in current associated with aging. In certain exemplary embodiments lifetime and/or failure is assessed via monitoring performance under modulation, for example random and/or deterministic jitter, open area verses closing of an eye diagram, rise time, fall time, extinction ratio, bit error rate, current voltage curves, or some other appropriate parameter or indicia relevant to a decrease in performance associated with aging or an increase in probability of failure.

In certain exemplary embodiments, a criterion for failure includes a 50 percent reduction in optical power for a constant current or a constant voltage. In certain exemplary embodiments, a failure is noted when laser diode drive current increases 20 percent, for example in connection with sustaining substantially uniform optical output power at 10 milliwatts or another suitable level. (These values, like all others presented herein, are examples and are neither limiting nor exhaustive. Embodiments of the present invention can generally support a wide range of engineering, design, physical, performance, and testing parameters and values.)

In certain exemplary embodiments, activities performed at step 1505 can include monitoring drive current during accelerated aging at various operating temperatures. Accordingly, testing can proceed via monitoring the drive current needed to obtain a specified level of optical power for a given temperature as the lasing system 1400 ages towards a full failure event or condition. Following burn in, accelerated aging test can be conducted at various temperatures to assess drive current for maintaining a specified level of optical power. In certain embodiments, the acquired data can be used to generate a family of curves.

For example, test stations can subject one group of the lasing systems 1400 to 200° C. while supplying sufficient current to achieve a fixed level of optical power, such as 15 milliwatts. As that group ages, efficiency decreases, the current requirements will typically increase, and failure becomes more likely. Test stations can subject another group of the lasing systems 1400 to a different elevated temperature while supplying sufficient electrical current to maintain the optical power level. In this manner, the acquired testing data can include temperature effects of laser gain profile 1230 (see FIG. 12H). That is, elevated temperature will typically shift and/or distort the laser gain profile 1230, and the data set collected at step 1510 can represent temperature sensitivity of the gain profile 1230. Accordingly, families of curves and data sets and/or multidimensional curves and tables can be collected at step 1510 to describe laser performance, laser parameters, accelerated aging, and failure statistics, for example.

At step 1510, laser lifetime is modeled according to tests conducted at step 1505. In certain exemplary embodiments, such a model takes time of operation and temperature into account. In certain exemplary embodiments, the model provides failure rate as a function of operating temperature and operating time at such temperatures. In certain exemplary embodiments, the model may further take output optical power, supply current, and/or voltage into account. Accordingly, certain embodiments of the model provide a relationship between temperature and lifetime and may further take into account optical power and electrical supply parameters such as current or voltage.

In certain exemplary embodiments, the model can be based on or derived from the Arrhenius equation. The Arrhenius equation can be characterized as a physics-based, life-stress model for temperature-dependent reliability testing. As will be appreciated by those of ordinary skill in the art having benefit of this disclosure, the Arrhenius equation provides a commonly-used and well-known tool for reliability assessment of semiconductor devices, including semiconductor lasers. The Arrhenius equation facilitates estimating laser lifetime at various operating temperatures and/or operating conditions based on information obtained via analyzing aging data at two or more temperatures, such as provided at step 1505 as discussed above. This information can include the activation energy for one or more failure mechanisms of the lasing systems 1400, for example.

In certain exemplary embodiments, the model can be based on the number of failures per billion hours of device operations ("billion device hours"). The model can provide FIT rate (number of failures per billion device hours of operation) as:

$$FIT \approx p^n j^m \exp(-E_a/kT)$$

As will be appreciated by those familiar with this known equation, p is output power density; j is operating current density; $E_a$ is activation energy that characterizes the primary temperature-dependent failure mechanisms; k is Boltzmann's constant ($8.617385 \times 10^{-5}$ eV/K); T is temperature in Kelvin degrees (typically junction temperature); and n and m characterize how strongly failure depends upon power and current density.

In certain exemplary edge emitting embodiments, activation energy $E_a$ is about 0.45 electron volts ("eV"). In certain exemplary VCSEL embodiments, activation energy $E_a$ is about 0.7-1.0 eV.

In certain exemplary embodiments, the model can define the median life as the lifetime at which cumulative failures reach 50 percent. That is, 50 percent of the population will have failed at the median life. In certain exemplary embodiments, the cumulative failure probability can have a substantially linear relationship to operating hours when plotted on a logarithmic scale, for example in a so-called lognormal plot of lifetime data. Accordingly the model can comprise a failure prediction model in the form of a lognormal distribution.

An exemplary probability distribution function for a lognormal model can be represented as:

$$f(t) = (1/(2\pi)^{1/2} \sigma t) x \exp\{(-\frac{1}{2}\sigma^2)[\ln(t/t_m)]^2\}$$

As will be appreciated by those familiar with this known equation, t is operating time, $t_m$ is median life, and $\sigma$ is standard deviation for the lognormal distribution.

In certain exemplary embodiments, the model can comprise one or more Goldthwaite curves. In certain exemplary embodiments, the model can characterize mean time to failure ("MTTF"). In certain exemplary embodiments, the model is based on or comprises the Weibul distribution. In certain exemplary embodiments, the model is based on or comprises an exponential distribution. In certain exemplary embodiments, the model can comprise a mathematical derivative or integral form of a failure probability equation. Thus, the model can comprise a provision for computing accumulated probability of failure as time elapses and/or at different temperatures.

Additional information about statistical reliability analyses is widely available to those of ordinary skill having benefit of this disclosure from a variety of books, manuals, and reference sources. One such source is the NIST/SEMATECH e-Handbook of Statistical Methods, July 2006, available on line from the Information Technology Library of the National Institute of Standards and Technology "NIST," specifically at the web address that begins with the customary hypertext transfer protocol and world wide web designator, followed by ".itl.nist.gov/div898/handbook/". (The NIST web address is presented in this form to avoid inadvertently providing a hyperlink in any electronic versions of this document.) The NIST website also refers to the document as "Engineering Statistics Handbook." Other references include: 1) Bellcore/Telecordia document GR-468-CORE, Issue 2, September 2004, *Generic Reliability Assurance Requirements for Optoelectronic Devices Used in Telecommunications Equipment;* 2) Reliability and Degradation of Semiconductor Lasers and LEDs authored by Mitsuo Fukuda and published by Artech House in 1991; and 3) *Accelerated Testing Handbook* written by D. S. Peck and O. D. Trapp and published by Technology Associates in 1981.

In certain exemplary embodiments, the model comprises a relationship between laser drive current and output power. For example, as the lasing system 1400 ages, the amount of current needed to achieve an acceptable output power can increase. (As discussed above, a detection feature 1470 (see FIG. 14) or a detector 530 (see FIG. 5A) can sense output power as feedback so that the control system 125 can adjust a laser's electrical supply to maintain a uniform output power and compensate for aging or other effects.) The model can define a threshold increase in current that specifies when the lasing system 1400 has aged to an unacceptable level. As discussed above, the model can further comprise multiple such currents, each for a different temperature. In such an embodiment, the model can comprise a lookup table, a set of curves, or a multi-dimensional function, for example.

In view of the foregoing, those of ordinary skill having benefit of this disclosure can implement and practice step 1510 and process 1500 in a wide range of embodiments and forms beyond those enabling ones that are described herein in detail. Such models can comprise, for example, one or more of curves, equations, computational formulas, code, computer executable instructions, statistical representations, statistics, thresholds, failure definitions, tables, and lookup tables as appropriate (not a limiting or exhaustive list).

At step 1515, the model is stored for usage by the control module 175. For example, the control module 175 can comprise memory that contains the model. As discussed above, such memory can either be an element of the control module 175 or can be accessed by the control module 175.

At step 1520, the transmitter 100 is outfitted or configured with multiple lasers, for example as discussed above with reference to FIG. 14. Thus, the transmitter 100 (or some other appropriate system) can comprise the lasing system 1400. So outfitted, the transmitter 100 is deployed in an application and begins operating. As discussed above, numerous types of applications, systems, and pieces of equipment can comprise the transmitter 100. Moreover, the lasing system 1400 can be deployed as a separate unit in a communication or computing system or some other appropriate system or device.

At step 1525, the control module 175 monitors or tracks the amount of current or electricity delivered to the one of the lasers 1410, 1420, 1430 that is running and/or the cumulative time of operation and the operating temperature. For example, the control module 175 can monitor and record operating temperatures in embodiments where the operating temperature changes, such as in connection with the control module 175 changing a setpoint 108, 109 to track a fluctuating temperature (see FIGS. 1 and 2 inter alia and the accompanying discussion).

In certain exemplary embodiments, the control module 175 can record monitoring data in an associated memory system or a database, for example. Such a memory system can keep track of the cumulative amount of time that each laser 1410, 1420, 1430 has operated and corresponding temperatures of operation. For example, the memory system might record that the laser 1410 has operated 1000 hours at 80° C., 5000 hours at 50° C., 100 hours at 90° C., and so forth. In certain exemplary embodiments, the control module 175 conducts a probability of failure computation and stores the updated computation at step 1525. Thus, as an alternative to storing raw operating conditions in long-term memory, the control module 175 can maintain a cumulative probability of failure and update the probability on an ongoing basis. Similar to the manner in which an odometer of a car provides a record of miles driven, the control module 175 can maintain a record of: hours operated; hours operated and associated temperatures of operation; hours operated and associated conditions that are relevant to lifetime or probability of failure; supply current; output power as determined by a detection feature 1470 or a monitoring detector 530; vectors (in the mathematical sense) that each describes temperature of operation, emitted power, and supply current; computed operating efficiency; other information related to aging or failure; assorted operational parameters; and/or accumulated probability of failure, for example (this is not an exhaustive list).

At step 1530, the control module 175 computes, estimates, predicts, determines, or otherwise assesses the amount of laser life remaining (or the amount of life consumed) or the probability of failure. The control module 175 can use the model (whether stored or otherwise accessed) for computing probability of failure, lifetime statistics, predicted time remaining until failure, or some other parameter, value, or result relevant to assessing performance degradation, end of life, or failure, for example. The control module 175 compares the computational result to a threshold that can also be stored in memory, for example. Accordingly, the control module 175 can statistically evaluate the extent to which operation at high temperature, or under some other condition that accelerates aging, has shortened laser lifetime and/or increased probability of failure.

In certain exemplary embodiments, the control module 175 evaluates the level of current that is applied to achieve and maintain a desired optical output power. The control module 175 can compare the monitored current level to a predetermined threshold or to one or more criteria. In certain exemplary embodiments, the current evaluation takes operational temperature into account. For example, the current level can be normalized to account for any temporary or permanent shifting of gain profile 1230 associated with high-temperature operation. A current value applied at one operating temperature may be different than a current valued applied at another operating temperature irrespective of aging. In certain exemplary embodiments, at step 1530 the control module 175 selects one current threshold from a table of current thresholds according to the current operating temperature.

At inquiry step 1535, the control module 175 determines whether the probability of failure is above the threshold. As discussed above, the control module 175 can also or alternatively determine whether supplied current has risen above a current threshold (that may or may not take gain profile attenuation or shift into account. Thus, at inquiry step 1535, the control module 175 makes a decision based on one or more computations and/or comparisons conducted in connection with step 1530.

If execution of step 1535 results in a negative determination, the flow of process 1500 loops back to step 1525 and execution continues. Thus, process 1500 can iterate steps 1525, 1530 and 1535 until the control module makes a positive determination at inquiry step 1535.

If execution of step 1535 results in a positive rather than a negative determination, then step 1540 executes. At step 1540, the control module 175 switches lasers. In other words, the lasing system 1400 switches from running whichever one of the lasers 1410, 1420, and 1430 has been running to another one of the lasers 1410, 1420, and 1430 that has substantial life remaining. Accordingly, process 1500 can mitigate premature failure connected with operating at high temperature or under other conditions that may adversely impact longevity.

Following step 1540, process 1500 loops back to step 1525 and continues. Thus, process 1500 can iterate tracking operating conditions, assessing the extent to which operating conditions have shortened laser lifetime or reduced performance, and switching to alternate lasers as appropriate.

The 46 paragraphs shown immediately below the present paragraph describe various features, functions, elements, and/or technologies that certain exemplary embodiments of the present invention may comprise. (These paragraphs are numbered solely for promoting readership and without limitation and are part of the present disclosure and teaching.)

1. An exemplary embodiment can comprise a method, for operating a first and a second laser disposed in an environment, comprising the steps of: setting the first laser to a first temperature at which the first laser is operable to output light having a wavelength in a wavelength division multiplexing channel; setting the second laser to a second temperature, substantially different than the first temperature, at which the second laser is operable to output light having a wavelength in the channel; and in response to determining a temperature of the environment, selecting the first set laser over the second set laser to output the light having the wavelength in the channel.

2. An exemplary embodiment can comprise a method in accordance with paragraph 1, wherein each of the first laser and the second laser has a respective free spectral range approximately corresponding to a difference between the first temperature and the second temperature, and wherein the first laser and the second laser are optically coupled to a common optical waveguide.

3. An exemplary embodiment can comprise a method in accordance with paragraph 1, wherein setting the first laser to the first temperature comprises heating the first laser to the first temperature, and wherein setting the second laser to the second temperature comprises heating the second laser to the second temperature.

4. An exemplary embodiment can comprise a method in accordance with paragraph 1, further comprising the step of heating the second laser to a third temperature, substantially different from the first temperature and the second temperature, subsequent to selecting the first set laser.

5. An exemplary embodiment can comprise a method in accordance with paragraph 1, further comprising the step of tracking changing temperature of the environment via setting the first laser and the second laser to staggered temperatures above the changing temperature.

6. An exemplary embodiment can comprise a method in accordance with paragraph 1, wherein the first laser and the second laser each comprises a respective wavelength selective reflector comprising a wavelength selectivity that is substantially uniform across substantially all expected temperature fluctuations of the environment.

7. An exemplary embodiment can comprise a method for emitting light, comprising: regulating temperatures of a first laser and a second laser to track fluctuating temperature of an operating environment in steps, the first laser and the second laser taking distinct temperature courses; and alternatingly emitting light of like wavelength from the first laser and the second laser at different temperature steps.

8. An exemplary embodiment can comprise a method for managing light processing devices, comprising: controlling respective temperatures of a first device and a second device to track stepwise a fluctuating temperature of an operating environment, each device following a distinct temperature track, wherein each device processes light in a temperature dependent manner and is disposed in a common enclosure.

9. An exemplary embodiment can comprise a method in accordance with paragraph 8, wherein the first device comprises a first laser, wherein the second device comprises a second laser, and wherein processing light in a temperature dependent manner comprises emitting a mode of light that shifts in wavelength according to temperature.

10. An exemplary embodiment can comprise a method in accordance with paragraph 9, wherein the first laser and the second laser are standardized units, and wherein the mode of light of the first laser has a like wavelength at two temperature steps.

11. An exemplary embodiment can comprise a method in accordance with paragraph 10, wherein the mode of light of the second laser has the like wavelength at two temperature steps.

12. An exemplary embodiment can comprise a method in accordance with paragraph 8, wherein each device following the distinct temperature track comprises staggering the respective temperatures of the first device and the second device above the fluctuating temperature.

13. An exemplary embodiment can comprise a method in accordance with paragraph 8, wherein the first device and the second device are disposed on a common substrate and sealed in a case that is permeable to water vapor, wherein the first device and the second device are coupled to a common optical waveguide, and wherein the method comprises alternatingly running the first device and the second device.

14. An exemplary embodiment can comprise a method for managing wavelength emission, comprising the steps of: providing a plurality of substantially collocated devices, each operative to emit a specified wavelength of light at each of a plurality of discrete temperature regimes; receiving a signal that monitors ambient temperature; in response to processing the signal with a circuit, selecting one of the devices and one of the discrete temperature regimes based on the monitored ambient temperature; and emitting the specified wavelength of light in response to operating the selected device in accordance with the selected discrete temperature regime.

15. An exemplary embodiment can comprise a method in accordance with paragraph 14, further comprising the steps of: selecting a second one of the devices and a second one of the discrete temperature regimes based on the monitored ambient temperature; and placing the second device in operational standby in the second discrete temperature regime.

16. An exemplary embodiment can comprise a method in accordance with paragraph 14, wherein each of the collocated devices is further operative to feed a common optical waveguide, and wherein the method further comprises switching between two of the devices in response to detecting a failure precursor or a failure predictor.

17. An exemplary embodiment can comprise a method for operating a first device and a second device, each operative to amplify light via stimulated emission of radiation, the method comprising: running the first device in a first temperature range to emit light aligned to a coordinate of a wavelength division multiplexing grid while the second device is in a second temperature range; and responsive to a thermal event, running the second device in the second temperature range to emit light aligned to the coordinate, disengaging the first laser, and placing the first laser in a third temperature range, wherein the first, second, and third temperature ranges are distinct.

18. An exemplary embodiment can comprise a light processing system, comprising: a first device operative to process light with temperature sensitivity and to implement a light processing result at a first temperature; a second device operative to process light with temperature sensitivity and to implement the light processing result at a second temperature substantially different than the first temperature; a temperature management system, in thermal communication with the first device and the second device, operative to apply the first temperature to the first device and the second temperature to the second device; and a circuit, operative to select one of the first device and the second device based on a signal conveying a temperature measurement.

19. An exemplary embodiment can comprise a light processing system, comprising: a first device operative to emit light complying with a criterion at a temperature in each of a plurality of temperature ranges and deviating from the criteria at another temperature in each of the plurality of temperature ranges; a second device operative to emit light complying with the criteria at a temperature in each of the plurality of temperature ranges and deviating from the criteria at another temperature in each of the plurality of temperature ranges; a temperature regulator, operably connected to the first device and the second device, operative to place the first device in one of the plurality of temperature ranges and the second device in another one of the plurality of temperature ranges; and a circuit, operably connected to the first device and the second device, operative to activate the first device and deactivate the second device in response to an event that comprises a change in temperature.

20. An exemplary embodiment can comprise a light processing system in accordance with paragraph 20, wherein the circuit is further operative to deactivate the first device and activate the second device in response to another event that comprises another change in temperature.

21. An exemplary embodiment can comprise a laser system comprising: a can or butterfly package that comprises a port for emitting light; a first laser and a second laser disposed inside the can or butterfly package and oriented for emitting light through the port; and an integrated circuit, connected to the first laser and the second laser, that is operable to perform a decision and activate selectively each of the first laser and the second laser for emitting light through the port.

22. An exemplary embodiment can comprise a laser system in accordance with paragraph 21, wherein a monolithic structure comprises the first laser and the second laser.

23. An exemplary embodiment can comprise a method for operating optical systems, comprising the steps of: deploying a first optical system and a second optical system in an operating environment, the first optical system operative, under each of a plurality of first operating conditions, to emit light complying with a performance criterion, and the second optical system operative, under each of a plurality of second operating conditions, to emit light complying with the performance criterion; applying to the deployed first optical system a selected one of the first operating conditions; applying to the deployed second optical system a selected one of the second operating conditions that is substantially different than the selected one of the first operating conditions; and based on a signal bearing information about the operating environment, selecting the deployed first optical system and operating the first optical system under the selected one of the first operating conditions; and in response to a change in the signal indicative of a fluctuation of the operating environment, ceasing or suspending an operation of the first optical system under the selected one of the first operating conditions and initiating an operation of the second optical system under the selected one of the second operating conditions.

24. An exemplary embodiment can comprise a method, for operating communication lasers, comprising the steps of: determining a maximum temperature of an operating environment that undergoes temperature fluctuations; disposing a first laser and a second laser in the operating environment; while the second laser is substantially inactive, maintaining a modulated wavelength of the first laser in a dense wavelength division multiplexing channel in response to operating the first laser at a first temperature set above the maximum temperature; determining if the operating first laser has aged to a threshold level; and responsive to the determination, if the first laser has aged to the threshold level: automatically changing the first laser to a substantially inactive state; automatically changing the second laser to a substantially active state; and maintaining a modulated wavelength of the second laser in the dense wavelength division multiplexing channel in response to operating the second laser at a second temperature set above the maximum temperature.

25. An exemplary embodiment can comprise a method in accordance with paragraph 24, wherein the first laser comprises a first edge emitting semiconductor laser, wherein the second laser comprises a second edge emitting semiconductor laser, wherein the maximum temperature of the operating environment is at least about 60 degrees Centigrade above a minimum temperature of the operating environment, and wherein determining if the operating first laser has aged a threshold level comprises executing instructions on a digital controller.

26. An exemplary embodiment can comprise a method in accordance with paragraph 24, wherein the first laser comprises a first distributed feedback laser, wherein the second laser comprises a second distributed feedback laser, and wherein the first distributed feedback laser and the second distributed feedback laser feed a common optical waveguide.

27. An exemplary embodiment can comprise a method in accordance with paragraph 24, wherein the first laser comprises a first waveguide extending along a surface of a die, wherein the second laser comprises a second waveguide extending along the surface of the die, and wherein determining if the operating first laser has aged to the threshold level comprises determining an accumulated time of operation and comparing the accumulated time of operation to a projected lifetime of the first laser.

28. An exemplary embodiment can comprise a method in accordance with paragraph 24, wherein operating the first laser at the first temperature comprises subjecting the second laser approximately to the first temperature, wherein operating the second laser at the second temperature comprises subjecting the first laser approximately to the second temperature, and wherein determining if the operating first laser has aged to the threshold level comprises evaluating performance of the first laser while the first laser is operating.

29. An exemplary embodiment can comprise a method in accordance with paragraph 24, wherein operating the first laser at the first temperature comprises transmitting water vapor between the operating environment and a light path of the first laser, and wherein operating the second laser at the second temperature comprises transmitting water vapor between the operating environment and a light path of the second laser.

30. An exemplary embodiment can comprise a method in accordance with paragraph 24, wherein maintaining the modulated wavelength of the first laser in the dense wavelength multiplexing channel comprises adjusting the first temperature to maintain the modulated wavelength of the first laser to within about 200 gigahertz of a wavelength coordinate of a dense wavelength division multiplexing grid, and wherein maintaining the modulated wavelength of the second laser in the dense wavelength division multiplexing channel comprises adjusting the second temperature to maintain the modulated wavelength of the second laser to within about 200 gigahertz of the wavelength coordinate of the dense wavelength division multiplexing grid.

31. An exemplary embodiment can comprise an optical communication system, comprising: a housing permeable to gas and comprising an outer surface; a plurality of lasers disposed in the housing, each laser comprising: a substrate comprising a waveguide operative to amplify light via stimulated emission of radiation; and a grating optically coupled to the waveguide and operative to control wavelength of the amplified light according to temperature, wherein at least part of the substrate is disposed for exposure to the permeated gas; a heating system, in thermal communication with each of the plurality of lasers, and operative to set temperature of the waveguide and the grating of each laser above a predicted or rated maximum operating temperature of the outer surface, the set temperature managing the wavelength for compliance with a wavelength specification for dense wavelength division multiplexing; and a circuit, coupled to the plurality of the lasers, operative to repeat the steps of: modulating a laser in the plurality of lasers to feed another waveguide until a substantial portion of the modulated laser's operating lifetime is consumed; and when the substantial portion of the modulated laser's operating lifetime is consumed, substantially ceasing modulation of the modulated laser and initiating modulation of another laser in the plurality of lasers to feed the another waveguide.

32. An exemplary embodiment can comprise a system in accordance with paragraph 31, wherein the grating is disposed substantially adjacent the waveguide, and wherein the circuit is operative to determine whether the substantial portion of the modulated laser's operating lifetime is consumed via assessing whether probably of failure has increased to a threshold level.

33. An exemplary embodiment can comprise a system in accordance with paragraph 31, wherein the circuit is operative to assess whether the substantial portion of the modulated laser's operating lifetime is consumed via statistically projecting results of failure-in-time testing.

34. An exemplary embodiment can comprise a system in accordance with paragraph 31, wherein the another waveguide is attached to a substrate of a planar lightguide circuit.

35. An exemplary embodiment can comprise a system in accordance with paragraph 31, wherein the set temperature is at least about 80 degrees Centigrade, with a modulation speed of at least about 1 gigabits per second.

36. An exemplary embodiment can comprise a system in accordance with paragraph 31, wherein the another waveguide comprises silicon, and wherein the waveguide of each laser comprises silicon.

37. An exemplary embodiment can comprise a system in accordance with paragraph 31, wherein managing wavelength for compliance with the wavelength specification for dense wavelength division multiplexing comprises maintaining wavelength within about 200 gigahertz of a specified wavelength, wherein the grating of each laser substantially adjoins the waveguide of each waveguide, wherein the each laser comprises an edge emitting laser, and wherein the another waveguide is optically linked to a planar lightguide circuit.

38. An exemplary embodiment can comprise a method for optical communication, comprising the steps of: deploying DWDM lasers in an operating environment subject to seasonal temperature fluctuations between a minimum and a maximum temperature; until probability of failure reaches a threshold, operating one of the deployed DWDM lasers at a first temperature elevated above the maximum temperature, the first temperature setting output wavelength of the operating DWDM laser within a DWDM channel for feeding modulated light to an optical waveguide; and in response to a controller determining that probability of failure reaches or passes the threshold, automatically ceasing operating the one deployed DWDM laser and initiating operating another one of the deployed DWDM lasers at a second temperature elevated above the maximum temperature, the second temperature setting output wavelength of the another deployed DWDM laser within the DWDM channel for feeding modulated light to the optical waveguide.

39. An exemplary embodiment can comprise a method in accordance with paragraph 38, wherein the deployed DWDM lasers remain substantially stationary during the step of automatically ceasing operating the one deployed DWDM laser and initiating operating another one of the deployed DWDM lasers.

40. An exemplary embodiment can comprise a method in accordance with paragraph 38, wherein determining that probability of failure reaches or passes the threshold comprises assessing accumulated time of operation.

41. An exemplary embodiment can comprise a method in accordance with paragraph 38, wherein the controller comprises a signal processing circuit, and wherein determining that probability of failure reaches or passes the threshold comprises evaluating laser performance with the signal processing circuit.

42. An exemplary embodiment can comprise a method in accordance with paragraph 38, wherein the deployed DWDM lasers are disposed in a common enclosure, and wherein the seasonal temperature fluctuations comprise a change in temperature of at least about 50 degrees Centigrade.

43. An exemplary embodiment can comprise a method in accordance with paragraph 38, wherein each of the deployed DWDM lasers comprises a surface adjoining gas, whereby emitted light transmits through the surface, and wherein the method further comprises exposing the surface of each deployed DWDM laser to water vapor of the operating environment.

44. An exemplary embodiment can comprise a method for operating optoelectronic devices, comprising: substantially collocating a first optoelectronic device and a second optoelectronic device, wherein the first optoelectronic device has a peak efficiency in a first temperature range for converting electrical energy to light, and wherein the second optoelectronic device has a peak efficiency in a second temperature range for converting electrical energy to light, the first temperature range separated from the second temperature range; monitoring temperature; selecting the first optoelectronic device or the second optoelectronic device in response to determining whether the monitored temperature is better aligned to the first temperature range or the second temperature range; and preferentially feeding electricity to the selected optoelectronic device.

45. An exemplary embodiment can comprise a method in accordance with paragraph 44 and further comprising converting the fed electricity to one of ultraviolet light, visible light, and near infrared light.

46. An exemplary embodiment can comprise a method for operating optoelectronic devices at peak efficiency, comprising the steps of: providing a first optoelectronic device and a second optoelectronic device attached to an electrical circuit, wherein the first optoelectronic device operates at a peak efficiency in a first temperature range, and wherein the second optoelectronic device operates a peak efficiency in a second temperature range, with a third temperature range disposed between the first and second temperature ranges; evaluating operating efficiency for the first optoelectronic device via monitoring power of light emitted from the first optoelectronic device relative to electricity supplied to the first optoelectronic device; and in response to determining that evaluated operating efficiency of the first optoelectronic device has decreased, switching from the first optoelectronic device to the second optoelectronic device; and in response to determining that evaluated operating efficiency of the second optoelectronic device has decreased, switching from the second optoelectronic device to the first optoelectronic device.

Technology useful for managing temperature sensitivity of optical systems has been described. From the description, it will be appreciated that an embodiment of the present invention overcomes limitations of the prior art. Those skilled in the art will appreciate that the present invention is not limited to any specifically discussed application or implementation and that the embodiments described herein are illustrative and not restrictive. Furthermore, the particular features, structures or characteristics that are disclosed may be combined in any suitable manner in one or more embodiments based on this disclosure and ordinary skill. Those of ordinary skill having benefit of this disclosure can make, use, and practice a wide range of embodiments via combining the disclosed features and elements in many permutations without undue experimentation. This disclosure not only includes the illustrated and described embodiments, but also provides a rich and detailed roadmap for creating many additional embodiments using the various disclosed technologies, elements, features, and their equivalents. From the description of the exemplary embodiments, equivalents of the elements shown herein will suggest themselves to those skilled in the art, and ways of constructing other embodiments of the present invention will appear to practitioners of the art. Therefore, the scope of the present invention is to be limited only by the accompanying claims.

What is claimed is:

1. A method for operating a first laser and a second laser disposed in an environment, the method comprising:
receiving a signal indicative of a temperature of the environment, the temperature of the environment fluctuating over time;
while the first laser is maintained at a first temperature and while the temperature of the environment deviates from the first temperature of the first laser by more than a first laser selection threshold, emitting light from the first laser into an optical waveguide; and
in response to the temperature of the environment deviating from the first temperature of the first laser by less than the first laser selection threshold, (i) emitting light from the second laser into the optical waveguide while the second laser is maintained at a second temperature, and (ii) deactivating the first laser.

2. A method for operating a first device and a second device disposed in an environment, each operative to amplify light via stimulated emission of radiation, the method comprising:

running, by a control module, the first device in a first temperature range to emit light aligned to a coordinate of a wavelength division multiplexing grid while the second device is in a second temperature range; and in response to a temperature of the environment deviating from a temperature of the first device by more than a second laser selection threshold, (i) running, by the control module, the second device in a second temperature range to emit light aligned to the coordinate of the wavelength division multiplexing grid, (ii) disengaging, by the control module, the first device, and (iii) placing, by the control module, the first device in a third temperature range, wherein the first, second, and third temperature ranges are distinct from one another.

* * * * *